United States Patent [19]
Fisher et al.

[11] Patent Number: 6,083,560
[45] Date of Patent: Jul. 4, 2000

[54] PROCESS FOR CONTROLLED DEPOSITION PROFILE FORCED FLOW CHEMICAL VAPOR INFILTRATION

[76] Inventors: Dean F. Fisher, 4573 South, 5400 West, West Valley City, Utah 84120; Timothy W. Lawrence, 204 Frances Amelia Dr., Huntsville, Ala. 35811

[21] Appl. No.: 08/752,450

[22] Filed: Nov. 15, 1996

Related U.S. Application Data

[60] Provisional application No. 60/006,839, Nov. 16, 1995.

[51] Int. Cl.$^7$ .................................................. C23C 16/00
[52] U.S. Cl. .......................... 427/249; 427/237; 427/240
[58] Field of Search ...................................... 427/236, 237, 427/238, 249, 240

[56] References Cited

U.S. PATENT DOCUMENTS

| | | | |
|---|---|---|---|
| 4,134,360 | 1/1979 | Fisher et al. | 118/49.1 |
| 4,212,906 | 7/1980 | Fisher et al. | 427/237 |
| 4,580,524 | 4/1986 | Lackey, Jr. et al. | 118/725 |
| 4,895,108 | 1/1990 | Caputo et al. | 118/728 |
| 5,298,311 | 3/1994 | Bentson et al. | 428/216 |
| 5,348,774 | 9/1994 | Golecki et al. | 427/238 |
| 5,350,545 | 9/1994 | Streckert et al. | 264/29.1 |
| 5,352,484 | 10/1994 | Bernard et al. | 427/228 |
| 5,480,678 | 1/1996 | Rudolph et al. | 427/248.1 |
| 5,652,030 | 7/1997 | Delperier et al. | 427/238 |

OTHER PUBLICATIONS

"Fiber Reinforced Tubular Composites by Chemical Vapor Infiltration", by D. Stinton et al., Chemical Vapor Deposition of Refractory Metals and Ceramics, Proceedings of the Symposium, Boston, MA, Dec. 4–6, 1991, Pittsburgh, PA, Materials Research Society.

"Deposition Kinetics in Forced Flow/Thermal Gradient Chemical Vapor Infiltration", by T. Starr, Georgia Institute of Technology, 12th Annual Conference on Composites and Advanced Ceramic Materials, Cocoa Beach, FL, Jan. 17–22, 1988, Ceramic Engineering and Science Proceedings, vol. 90, 1988, pp. 803–811.

"Synthesis of Fiber–Reinforced Sic Composites by Chemical Vapor Infiltration", by D. Stinton et al., American Ceramic Society Bulletin, vol. 65, Feb. 1986, pp. 347–350.

"Fabrication of Ceramic Composites: Forced CVI", by T. Besmann, presented at the 96th Annual Meeting of the American Ceramic Society, Indianapolis, IN, Apr. 24–28, 1994.

"Scale–Up and Modeling of Forced Chemical Vapor Infiltration", by T. Besmann, 185th Annual Conference on Composites and Advanced Ceramic Materials, Cocoa Beach, FL, Jan. 9–14, 1994, Ceramic Engineering and Science Proceedings.

"Modeling of Chemical Vapor Infiltration for Composite Fabrication", by T. Starr (GTRI) and T. Besmann (ORNL), presented at the International Conference on High Temperature Ceramic Matrix Composites, Bordeaux, France, Sep. 20–25, 1993.

"Modeling of Forced CVI for Tube Fabrication", by T. Starr (GTRI) and A. Smith (ORNL), ORNL Report No. DE94–004544. (no date).

"Finite Volume Model for Forced Flow/Thermal Gradient Chemical Vapor Infiltration", by T. Starr (GTRI) and A. Smith (ORNL), ORNL Report No. DE91–012531. (no date).

"Development of High–Density Silicon–Carbide FCVI Composites", by Y. Roman et al., ORNL Report No. DE91–000922. (no date).

"Fabrication of Carbon–Carbon Composites by Forced Flow Thermal Gradient Chemical Vapor Infiltration", by S. Vaidyaraman et al., Journal of Materials Research, vol. 10, No. 6, Jun. 1995, pp. 1469–1477.

"Review, Status and Future of the Chemical Vapor Infiltration Process for Fabrication of Fiber–Reinforced Ceramic Composites", by W. Lackey, 13th Annual Conference on Composites and Advanced Ceramic Materials, Cocoa Beach, FL, Jan. 15–18, 1989, Ceramic Engineering and Science Proceedings, vol. 10, 1989, pp. 577–584.

"Contribution of Gas–Phase Reactions to the Deposition of SIC by a Forced–Flow Chemical Vapor Infiltration Process", by A. Tsai Chemical Vapor Deposition of Refractory Metals and Cermaics, II, Proceedings of the Symposium, Boston, MA. Dec. 4–6, 1991, Materials Research Society, 1992, p. 227–232.

"Modeling and Analysis of Processing of Ceramic Matrix Composites" by A. Tai et al, Proceedings of the 8th International Conference on Composite Materials, Honolulu, HI, Jul. 15–19, 1991, Society for the Advancement of Material and Process Engineering, 1991, p. 24–E–1 to 24 E–6.

"Properties of Ceramic–Ceramic Composites Fabricated by Forced Chemical Vapor Infiltration" by A. Lowden, Am. Society For Composites, Technical Conference, Lansing, MI, Jun. 12–14,1990, Technomic Publishing Co. Inc., 1990, p. 774–788.

"The Thermal Conductivity of Carbon Coated Silicon Carbide Fibers Embedded in a Silicon Carbide Matrix", by A. Beecher, Presented at the 22nd Inter'l Thermal Conductivity Conference, Tempe, AZ, Nov. 7–10, 1993.

"Forced Flow Chemical Vapour Infiltration" by A. Roman et al, Sponsored by TN Inst. For Applied Physics. (no date).

"Investigation of Forced and Isothermal Chemical Vapor Infiltrated SIC/SIC Ceramic Matrix Composites", by A. Sankar et al, (no date).

Nextral/SIC Composites Using Forced Chemical Vapor Infiltration by A. Weaver et al, presented at the HTCMC Meeting, France, Sep. 20–23, 1993.

"Modeling of Forced Flow/Thermal Gradient Chemical Vapor Infiltration" by A. Starr et al, prepared for Oak Ridge National Lab, TN. (no date).

(List continued on next page.)

*Primary Examiner*—Janyce Bell

[57] ABSTRACT

A method and apparatus for forced flow/thermal gradient chemical vapor infiltration (CVI) of fibrous porous structure to create a simultaneous deposition of a carbon matrix throughout the substrate.

4 Claims, 14 Drawing Sheets

OTHER PUBLICATIONS

"Chemical Vapor Infiltration of Fiber–Reinforced Ceramic Composites" by A. Stinton, et al, presented at the 2nd International Sumposium on Ceramic Materials and Components for Engines, Luebeck–Travemuende, W. Germany, Apr. 14, 1986.

"Carbon/Carbon Processing By Forced Flow–Thermal Gradient Chemical Vapor Infiltration Using Propylene" by Sundar Vaidyaraman et al, Carbon vol. 34, No. 3, pp. 347–362, 1996.

"Forced Flow–Thermal Gradient Chemical Vapor Infiltration (FCVI) For Fabrication of Carbon/Carbon" sy Sundar Vaidyaraman et al, Carbon vol. 33, No. 9, pp. 1211–1215, 1995. (no mo.).

"1–D Model For Forced Flow–Thermal Gradient Chemical Vapor Infiltration Process for Carbon/Carbon Composites", Carbon No. 34, No. 9, pp. 1123–1133, 1996. (no mo.).

Four Advances In Carbon/Carbon Materials Technology, by H. Maahs et al (no date).

"Densification of a Thick Disk Preform with Silicon Carbide Matrix by CVI Process" by T. Huynh et al, Ceram. Eng. Sci. Proc. 12(9–10), pp. 2005–2014, 1991 (no mo.).

"Carbon/Carbon Processing by Forced Flow–Thermal Gradient Chemical Vapor Infiltration (FCVI) Using Propane" by S. Vaidyaraman et al, Carbon vol. 34, No. 5, pp. 609–617, 1996. (no mo.).

"Quicker Carbon–Carbon Parts", by S. Ashley, Mechanical Engineering, Dec. 1994, p. 37.

"New VCI Process Cuts Costs of CarbonCarbon Composites", by W. J. Lackey, Advanced Materials & Processes, vol. 146, No. 3, Sep. 1994.

"Improved Process for C/C Composites", by W. J. Lackey, American Ceramic Society Bulletin, p. 30 years unknown.

"Producing Carbon/Carbon Fast–Fast", edited by Ruth Koxeter, Science & Technology, p. 76, Business Week, Jul. 18, 1994.

"Improved Process for Carbon/Carbon Composite", from Technology Update, Aerospace Engineering/Sep. 1994.

"Brake Disc Technology Speeds Production X100", American Ceramic Society Bulletin, p. 34. year unknown.

Brochure: "The RD Process for Carbon–Carbon" from Textron Specialty Materials, Lowell, MA. (no date).

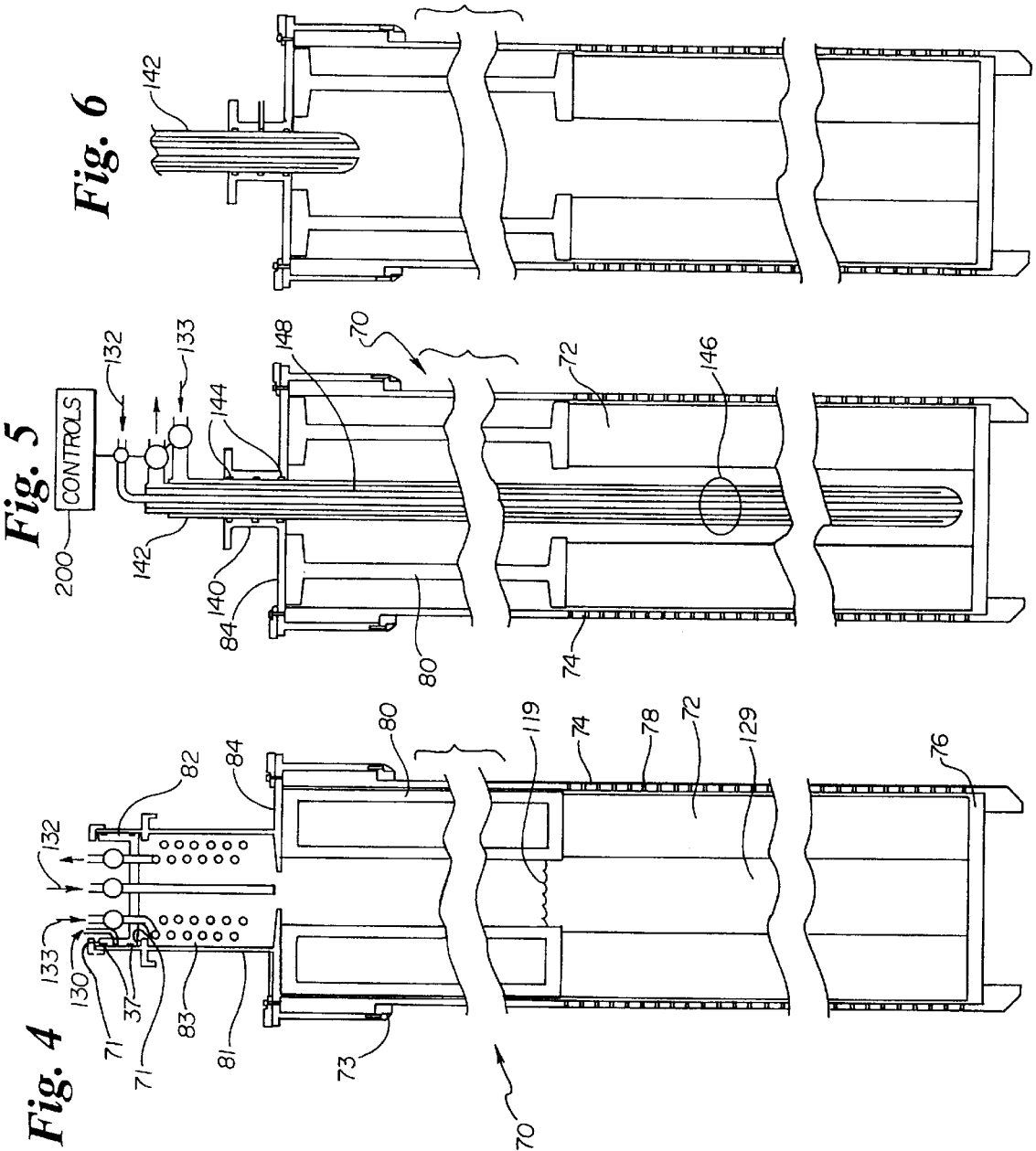

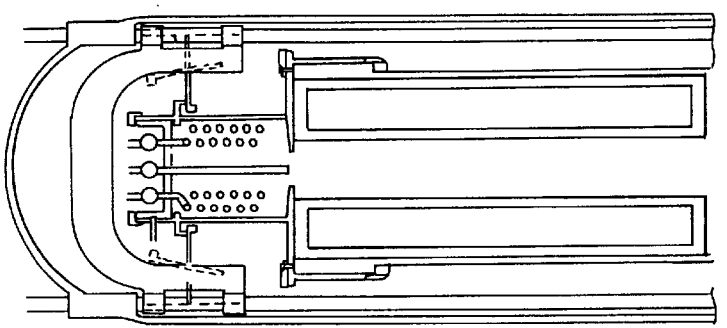
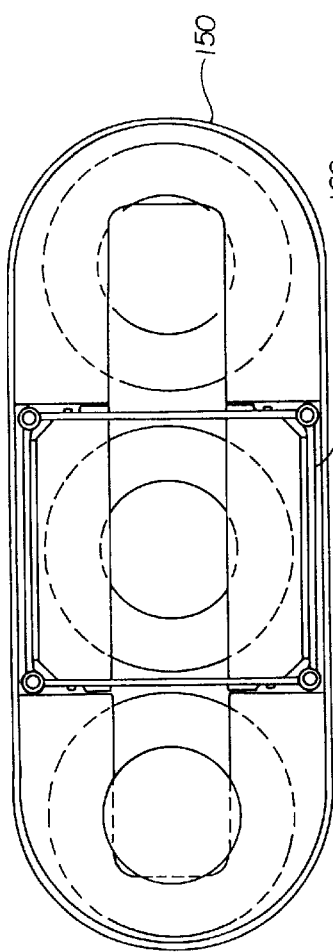
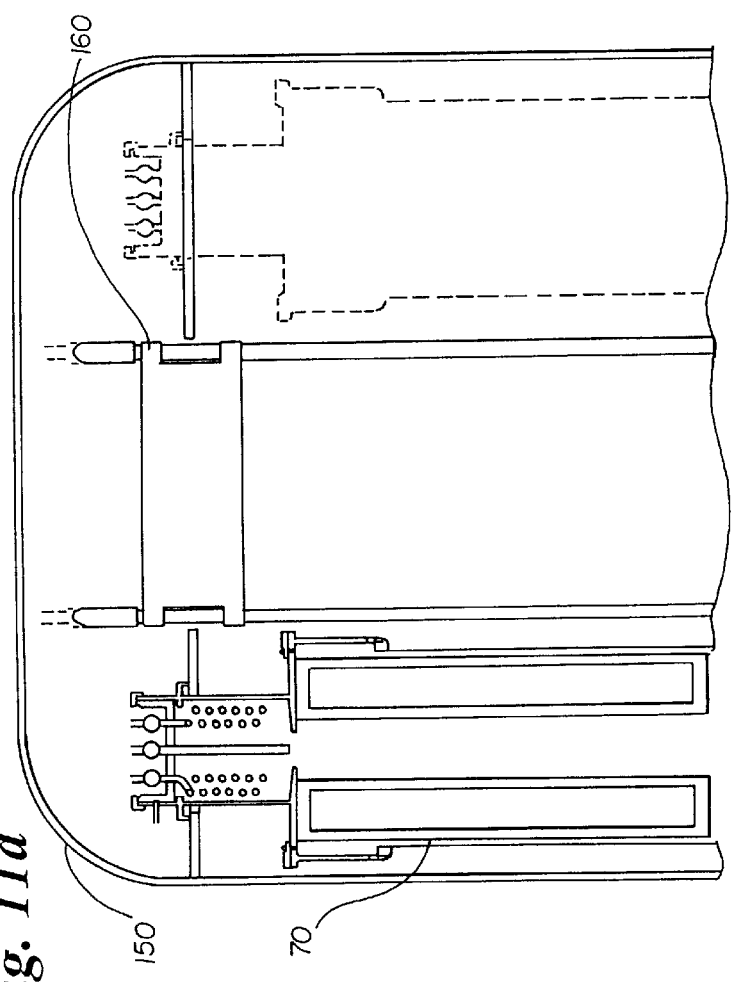

PROCESS FOR CONTROLLED DEPOSITION PROFILE FORCED FLOW CHEMICAL VAPOR INFILTRATION

RELATIONSHIP TO OTHER APPLICATION

The present application is a continuation-in-part application of U.S. provisional application Ser. No. 60/006,839, filed on Nov. 16, 1995, having the above title, which is herein incorporated by reference in its entirety.

PROPRIETARY NOTICE

The Government has rights in this invention pursuant to Contract No. NA58-37801, awarded by N.A.S.A.

FIELD OF THE INVENTION

The present invention relates to a method for forced flow chemical vapor infiltration which reduces process time and improves the densification of thicker parts.

BACKGROUND OF THE INVENTION

Carbon—carbon composites are used for rocket nozzle throats and exit cones, aircraft brakes, hypersonic vehicle leading edges and other high temperature structures. Current carbon—carbon densification processes are costly and slow, involving either 6–8 pitch impregnation-carbonization cycles or 400–600 hours of chemical vapor infiltration (CVI). It is often necessary to interrupt the CVI process and machine off the exterior surfaces of the substrate to open pore channels to the interior. Current CVI processes cannot densify low-permeability preforms or parts thicker than about 1½ inches. The present inventive method reduces process time and improves densification.

Carbon—carbon (C—C) composites CVI densified with pyrolytic carbon matrices are an erosion resistant and structurally efficient material used on solid rocket motor nozzle exit cones and C—C brake disks for commercial and military aircraft. The current process, known as isothermal CVI, is costly and limited to thin components. In the isothermal CVI process the gas, usually methane, flows past parts resting in a furnace. Gas transport into the interior of the part is driven by diffusion. To deposit uniformly through the thickness and prevent closing off surface pores, the isothermal process uses extremely low deposition rates, requiring hundreds of hours of deposition. Even with very low rates, uniform densification of most substrates is difficult in preforms thicker than 50 mm (2.0 inch). Isothermal CVI densification is, therefore, limited to components such break discs and as the thin nozzle exit cone. The high cost further limits the material to the nozzles of strategic and space motors only. To densify thicker parts such as the nozzle integral throat entry (ITE), a pressure impregnation-carbonization process is used. As many as eight impregnation-carbonization and graphitization cycles are required. Lower cost carbon—carbon ITEs are needed for future propulsion systems. Other existing and potential applications such as spacecraft structures, automotive pistons and aircraft brakes would also benefit from improvements in densification processes.

The following references further describe the field of art and are herein incorporated by reference:

U.S. Pat. No. 4,134,360, Apparatus for Vapor Deposition on Tubular Substrate, discloses a process utilizing radial forced flow through a thick walled cylinder and a solid log preform. The part is directly heated by inductive coupling of the part. This process can process only one stack or log at a time in a furnace and the furnace must be cooled after each load. There is no active internal cooling. Thus, unless longer densification processes are used or thinner substrates used, preferential deposition of the inside surface will result and the part will be unacceptable for desired applications. Greater pressure must be applied to permit densification of individual disks using hydraulic or air actuated ram, which is not required in the present inventive process.

U.S. Pat. No. 4,212,906, Method for the Production of Carbon/Carbon Composite Material, which is a continuation of U.S. Pat. No. 4,134,360, discloses densification of a long continuous substrate which is subsequently parted into individual brake disks.

U.S. Pat. No. 4,580,524, Process for the Preparation of Fiber-Reinforced Ceramic Composites by Chemical Vapor Deposition, is specific to ceramic composites and employs steep thermal gradient. The deposition is progressive, where the process gas first preferentially reacts at and deposits on the fibers in the region of the hot surface. Deposition occurs progressively from the hot surface toward the cold surface and edges. In contrast, the present inventive process produces a substantially uniform deposition rate throughout the substrate. Unlike the substrate of the process of the present application, the substrate in '524 must be thin, due to the deposition progression from the outer to inner surface. Further, the '524 process deposits ceramic matrix, specifically SiC, $S_3N_4$.

U.S. Pat. No. 4,895,108, CVD Preparation of Fiber Reinforced Ceramic Composites, discloses a similar process and apparatus to the process for densification of cylindrical substrates of U.S. Pat. No. 4,580,524 (Lackey), but indicates cooling of the inner surface with the Lackey process is inadequate. Enhanced cooling of the inner surface is achieved by a water cooled mandrel in contact with the part inner surface. The mandrel has circumferential and axial grooves on its surface for gas distribution. Water flows through concentric tubes at the core centerline.

U.S. Pat. No. 5,350,545, Method for Fabricating Composites, discloses rigidization using preceramic polymers prior to CVI densification. The thickness of the substrate is limited to a few centimeters and the process utilizes a ceramic matrix only.

U.S. Pat. No. 5,348,774, Method of Rapidly Densifying a Porous Structure, discloses a process utilizing a thermal gradient only, no forced flow. The part must be heated by inductive coupling of the part with an RF field from the furnace coil.

U.S. Pat. No. 5,480,678, Apparatus for Use With CVI/CVD Processes, discloses a forced flow process without a thermal gradient. The process is specific to stacks of thin parts separated by spacers which direct the flow of the process gas through the parts.

The following are herein incorporated by reference:

Fiber Reinforced Tubular Composites by Chemical Vapor Infiltration, D. Stinton, et al. Chemical vapor deposition of refractory metals and Ceramics ll, Proceedings of the symposium, Boston, Mass., Dec. 4–6, 1991, Pittsburgh, Pa., Materials Research Society. The process uses a water cooled tube to cool inside surface of specimen.

Deposition Kinetics in Forced Flow/thermal Gradient Chemical Vapor Infiltration, T. Starr, Georgia Institute of Technology, 12th Annual Conference on Composites and Advanced Ceramic Materials, Cocoa Beach, Fla., Jan. 17–22, 1988, Ceramic Engineering and Science Proceedings, Vol. 90, 1988, pp. 803–811. Kinetic modeling of Ceramic FCVI.

Synthesis of Fiber-reinforced Sic Composites by Chemical Vapor Infiltration, D. Stinton, et al, American Ceramic Society Bulletin, Vol. 65, February 1986, pp. 347–350.

Fabrication of Ceramic Composites: Forced CVI, T. Besmann, presented at 96th Annual meeting of the American Ceramic Society, Indianapolis, Ind., Apr. 24–28, 1994.

Scale-up and Modeling of Forced Chemical Vapor Infiltration, T. Besmann, 18th Annual Conference on Composites and Advanced Ceramic Materials, Cocoa Beach, Fla., Jan. 9–14, 1994, Ceramic Engineering and Science Proceedings.

Modeling of Chemical Vapor Infiltration for Composite Fabrication, T. Starr (GTRI), T. Besmann (ORNL), presented at International Conference on High Temperature Ceramic Matrix Composites, Bordeaux, France, Sep. 20–25, 1993.

Modeling of Forced CVI for Tube Fabrication, T. Starr (GTRI), A. Smith (ORNL), ORNL Report No. DE94-004544.

Finite Volume Model for Forced Flow/thermal Gradient Chemical Vapor Infiltration, T. Starr (GTRI), A. Smith (ORNL), ORNL Report No. DE91-012531.

Development of High-density Silicon-carbide FCVI Composites, Y. Roman, et al, ORNL Report No. DE91-000922.

Fabrication of Carbon—carbon Composites by Forced Flow Thermal Gradient Chemical Vapor Infiltration, S. Vaidyaraman, J. Lackey, et al., Journal of Materials Research, Vol. 10, No. 6, June 1995, pp. 1469–1477.

Review, Status and Future of the Chemical Vapor Infiltration Process for Fabrication of Fiber-reinforced Ceramic Composites, W. Lackey, 13th Annual Conference on Composites and Advanced Ceramic Materials, Cocoa Beach, Fla., Jan. 15–18, 1989, Ceramic Engineering and Science Proceedings, Vol. 10, 1989, pp. 577–584.

SUMMARY OF THE INVENTION

A method is provided in this invention for the densification of substrate columns or stacks using a CVI process with both forced flow and thermal gradient. The combination of forced flow with thermal gradient permits uniform deposition through the substrate thickness at a more rapid rate than is possible with either method alone. The method permits densification of parts thicker than 8 inches in 5–50 hours of CVI, depending on preform architecture and final density requirements. A number of substrates may be simultaneously densified within a common furnace. This results in significant savings in the procurement, maintenance and operation of facilities. Gas flow and temperature gradient may be axial or radial. In a suitable furnace the preform/tooling system is heated to provide an increasing temperature from inlet to outlet. The process gas is introduced at an elevated pressure at the inlet end of the part and a lower pressure is created at the outlet, forcing the gas through the part. The gas reacts and deposits the desired matrix material on the surface of the preform fibers. Gas flow rate and/or inlet and outlet pressures are controlled. Process conditions are chosen to provide the desired deposition profile. The preferred deposition profile provides simultaneous deposition throughout the part.

In one embodiment the part is positioned in a canister and adapter containing the means for introducing the reactants into the central cavity of the substrate and also the means of cooling the interior surface of the substrate. A number of parts in individual fixtures are inserted through ports in the furnace lid which place each part in proximity to the furnace heating element or susceptor. To ensure uniform temperature around its circumference the part and fixture are rotated about the part axis.

Process conditions of temperature, temperature gradient, reactants, reactant flow rate, and inlet and outlet pressure are chosen to provide the required deposition rate and deposition rate profile through the substrate wall.

In addition to the advantages associated with processing multiple columns or stacks of parts within a furnace, the method permits heat treating without opening or cooling the furnace. When provided with a loading enclosure placed over the furnace lid and equipped with a means of raising and lowering the fixture containing the substrate parts loading and unloading may be accomplished without fully cooling the furnace. Existing, conventional furnaces, both top and bottom loading, may be modified to carry out the process.

BRIEF DESCRIPTION OF THE DRAWINGS

A detailed description of the invention is hereafter described with specific reference being made to the drawings in which:

FIG. 4 shows a densification module of the invention with a heat exchanger;

FIG. 5 shows a densification module of the invention with a lance;

FIG. 6 shows a densification module of the invention with the lance partially withdrawn;

FIGS. 11a, 11b and 11c show side, top and end views, respectively, of an elevator apparatus of the invention.

DETAILED DESCRIPTION OF THE INVENTION

With the forced flow CVI process of the present invention, process time reduction and increased thickness can be achieved through active gas transport. In the forced flow process the part is encased in a shell with openings at each end. The gas passes through the part, driven by increased pressure at the inlet. The part temperature increases toward the outlet to compensate for the reduction in carbon content and the increase in hydrogen as the gas flows through the preform. Thus, rapid and uniform deposition is possible regardless of thickness.

The forced flow CVI process of the present invention permits densification of thick parts in 5–50 hours of CVI, depending on preform architecture and final density requirements. The process may be applied to any shape in which relatively uniform gas flow can be created when enclosed in impermeable tooling with gas inlet and outlet ports.

Figure 1:
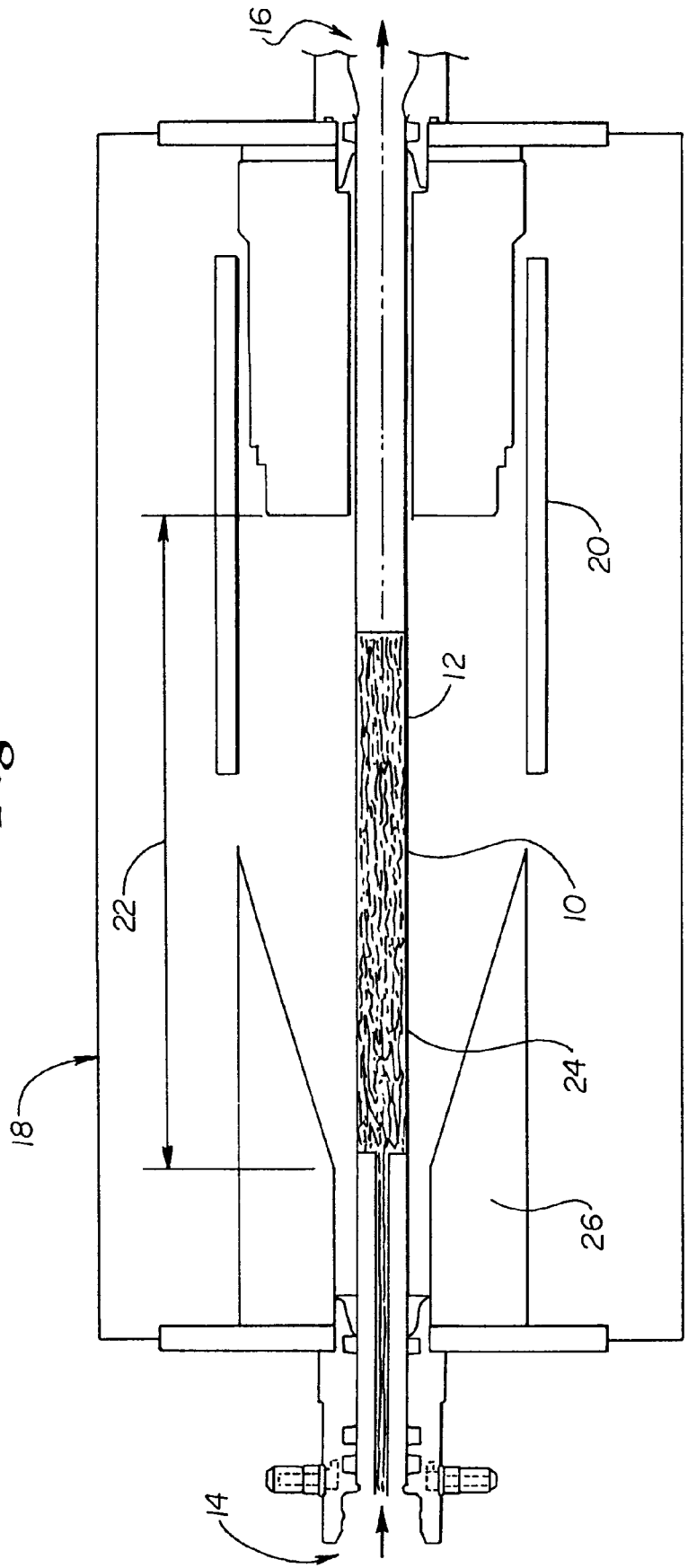
FIG. 1 shows an apparatus of the invention for axial densification.
Figure 12:
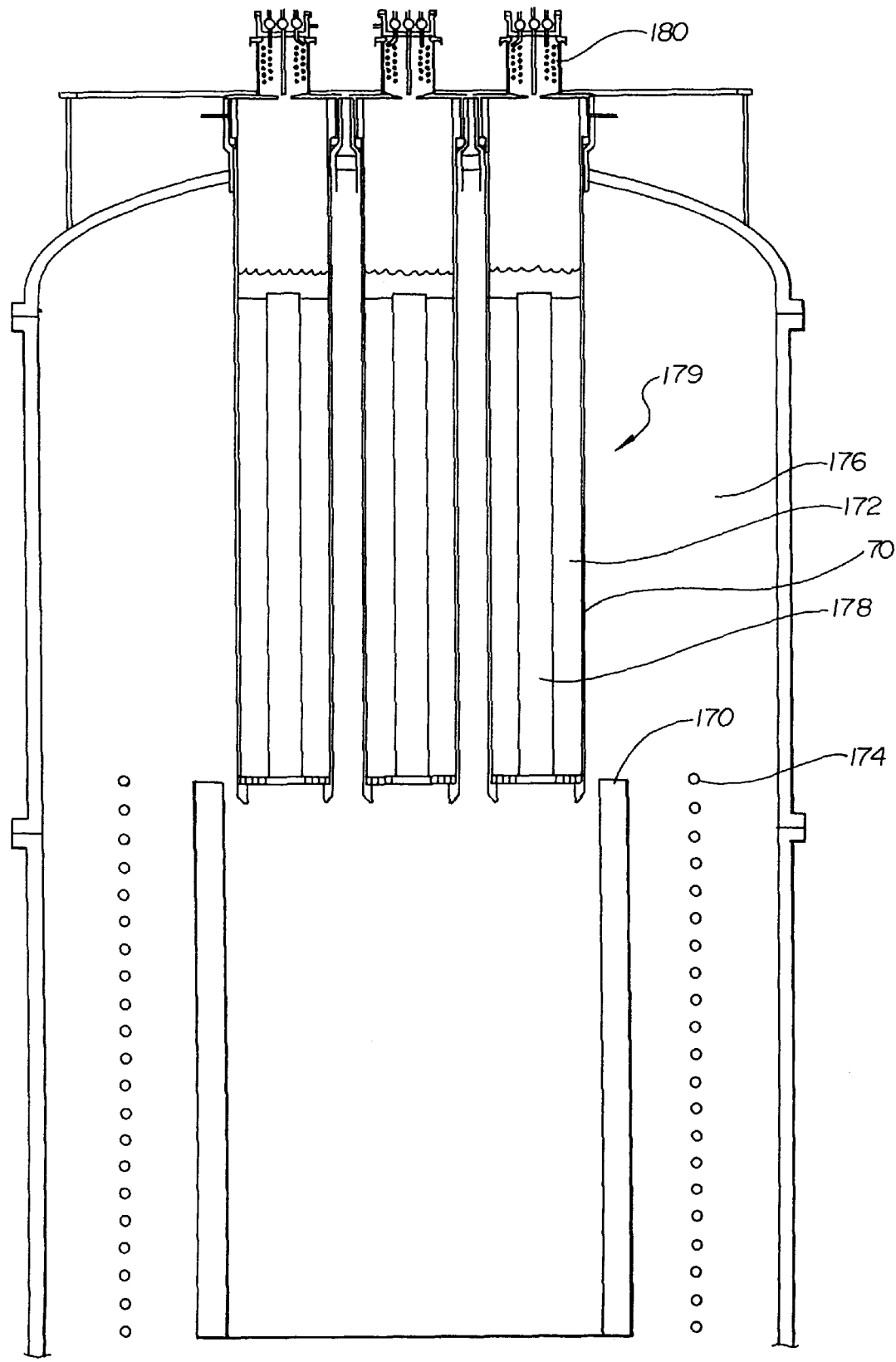
FIG. 12 shows another embodiment of the densification apparatus of the invention.
Figure 13A:
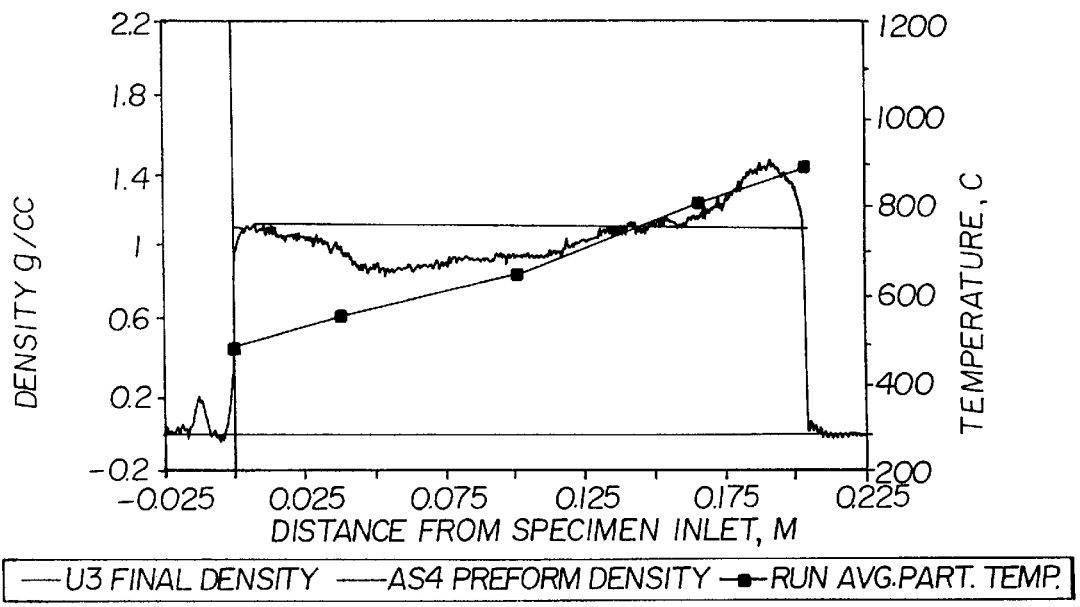
FIGS. 13a–15b illustrate densified specimen and preform density profiles and run temperature profiles of unidirectional specimens.
Figure 13B:
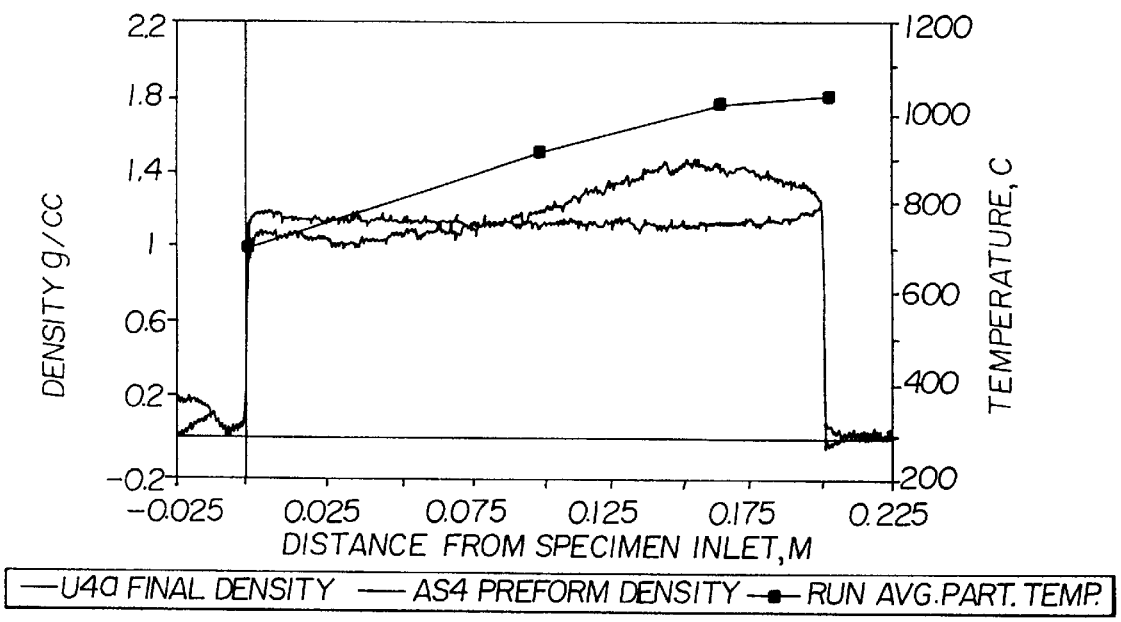

FIGS. 1 and 12 illustrate the axial densification process, wherein a substrate is densified in the direction of its axis, and FIGS. 2–11 illustrate the radial densification process, wherein an annular substrate is densified from its inner side toward its outer side.

In the present inventive process, a porous preform consisting of fibrous, particulate or other permeable material, preferably carbon fiber, is "densified" with matrix material, preferably carbon, to form a rigid, structural body. Fibrous preforms may be unidirectional or woven fabric or tape, nD-woven, braided, chopped, filament wound or other suitable architecture known to those skilled in the art.

As seen in FIG. 1, which illustrates axial densification and which was the subject of the later mention examples, the preform 10 is enclosed in impermeable tooling 12 (e.g. carbon, quartz, ceramic) with a gas inlet port 14 which is connected to a supply of the process gas and an outlet port 16 which exhausts to a vent or vacuum pump. Multiple ports may be used for complex parts.

In a suitable furnace, generally designated as 18, the preform tooling system is heated to provide an increasing temperature from inlet 14 to outlet 16. The furnace 18 may be heated resistively or inductively. The furnace may employ a single heating zone 20 surrounding or above the hotter outlet end of the part(s), multiple, independently controlled heating zones surrounding the part(s) and/or a flat heat source above the hot (outlet) end of the part or a number of parts.

The process gas is introduced at an elevated pressure at the inlet end 14 of the part and a lower pressure is created at the outlet 16, forcing the gas through the part. The gas reacts and deposits the desired matrix material on the surface of the preform fibers 10. Gas flow rate and/or inlet and outlet pressures are controlled as desired. The gas composition, gas residence time and temperature profile within the preform are chosen to provide the desired deposition profile. Uniform deposition rate through the part can be obtained by actively adjusting process parameters during the run to compensate for changes in the permeability of the part. Process parameters which might be adjusted during the process to maintain the desired uniform deposition profile include temperature, temperature gradient, gas composition and flow rate and inlet and outlet pressure. Linear decreasing gas flow rate improves densification uniformity. Uniformly densified parts may also be obtained with prescheduled run parameters selected to initially provide very slightly increasing deposition rate from inlet to outlet. "Increasing" processes, those in which deposition rate increases from inlet to outlet end of the part, are stable or self-correcting. As densification progresses, the reduction in the flow channel cross-section within the part increases gas pressure and/or residence time increasing the deposition rate of the inlet end relative to the outlet end. A process producing a slightly increasing deposition rate will become neutral or slightly decreasing as the process progresses and thus produces a uniformly dense final part. Initially decreasing processes are processes producing greater deposition at the inlet end of the part compared with the outlet end.

Deposition within the part increases the concentration(s) of reaction products in the gas. The presence of the reaction product in the process gas has the effect of reducing the reaction rate. The effect is more pronounced near the inlet end of the part since the gas farther downstream already contains reaction product from upstream reactions. It is sometimes desirable to add the reaction product (e.g. hydrogen, in the case of carbon deposition from hydrocarbon source gases) to the incoming process gas to produce more uniform gas composition within the part and modify deposition rate and profile.

Densification of carbon—carbon composites has been achieved using unidirectional carbon fiber preforms (AS4 PAN (polyacrylonitrile) and P55 pitch-based fiber known to those skilled in the art) with hydrocarbon process gas (methane, propane and ethylene) both with and without added hydrogen. FIG. 1 shows a representative configuration of the preform and tooling for the densification runs.

FIG. 1 displays a gradient hot zone 22, a shortened heating element 20, optional thermocouples 24 and insulation 26.

Fifteen process development runs were conducted using unidirectional fiber preforms of either AS4 or P55 carbon fiber. For the runs seven process parameters were varied at three levels each as shown in Table 1.

TABLE 1

| Range of Conditions for Process Development Runs | |
|---|---|
| Maximum temperature (part outlet end) | 847 to 1141° C. |
| Temperature gradient (part inlet to outlet end) | 200 to 450° C. |
| Hydrocarbon gas | methane, propane, ethylene |
| Hydrogen concentration, volume percent of hydrocarbon gas | 0, 10%, 67% |
| Average hydrocarbon gas flow rate | 2.6 to 24.1 standard liters per hour |
| Flow profile | a) constant flow rate, decreasing flow rate: b) 200% of average flow rate to 0 c) 150% of average flow rate to 50% |
| Outlet pressure | 1.33 to 130kPa (10 to 975 torr) |

A number of combinations produce densification to uniform density. The parameters are interdependent and a change in one parameter of a neutral process requires changes in other parameters to restore optimum deposition profile. An increase in outlet temperature, for example, can be offset by increases in temperature gradient, flow rate and/or hydrogen level. On the other hand a decreasing process can be rendered more neutral (or increasing) by decreasing the overall temperature or increasing the temperature gradient, flow rate or hydrogen level. Methane at higher temperature and possibly requiring increased hydrogen addition appears equivalent to propane. The higher temperature levels, higher flow levels, lower outlet pressures, lower hydrogen levels and decreasing flow profiles produce more rapid deposition. Two exemplary runs, runs 14 and 16 are described in Table 2.

TABLE 2

Process Conditions for Two Forced Flow CVI Runs

|  | Run 14 | Run 16 |  | Run 14 | Run 16 |
|---|---|---|---|---|---|
| Maximum temperature | 968° C. | 1059° C. | Hydrocarbon gas | propane | propane |
| Temperature gradient | 200–250° C. | 300–350° C. | Hydrocarbon gas flow rate | 5.22 slh | 7.83 slh |
| Outlet pressure | 1.3 kPa | 13.3 kPa | Hydrogen concentration | 0 | 10% |
| Inlet pressure (not controlled) | both runs reached equipment limit; 700 kPa | | Flow profile | 200–0% decr. | 200–0% decr. |

Preforms for both runs were unidirectional P55 fiber (64% fiber volume). Run 14 reached a density of 1.81 g/cm$^3$ (9.5% void volume) in 16 hours. Run 16 was run for 6.5 hours and reached a density of 1.78 g/cm$^3$ (11% void volume). Both runs demonstrated full penetration (i.e. uniform densification) of the 8 inch long flow path. 12% or less void volume is considered sufficiently densified.

The maximum temperature used in the demonstration runs was limited by the quartz tooling used to enclose the fiber specimens. Higher temperatures, preferably coupled with lower process gas partial pressures, can increase deposition rates.

In an application of the inventive process, densification of an annular or similar body can be conducted with radial gas flow. A significant feature of the method is densification of a preform "log" which may be five feet long and which provides material for the machining of many parts (brake disks, rocket nozzle throats, etc.) at lower per part cost. Forced flow processes densifying individual brake disks, for example, by flowing the process gas through the thickness of the individual part, require a set of tooling, including gas containment shell, gas ports, gas seals and gas delivery ducts for each part. The costs of providing and installing the tooling defeat the savings from reduced densification time. Therefore, densification of a log from which individual part may be cut is desirable.

Figure 2:
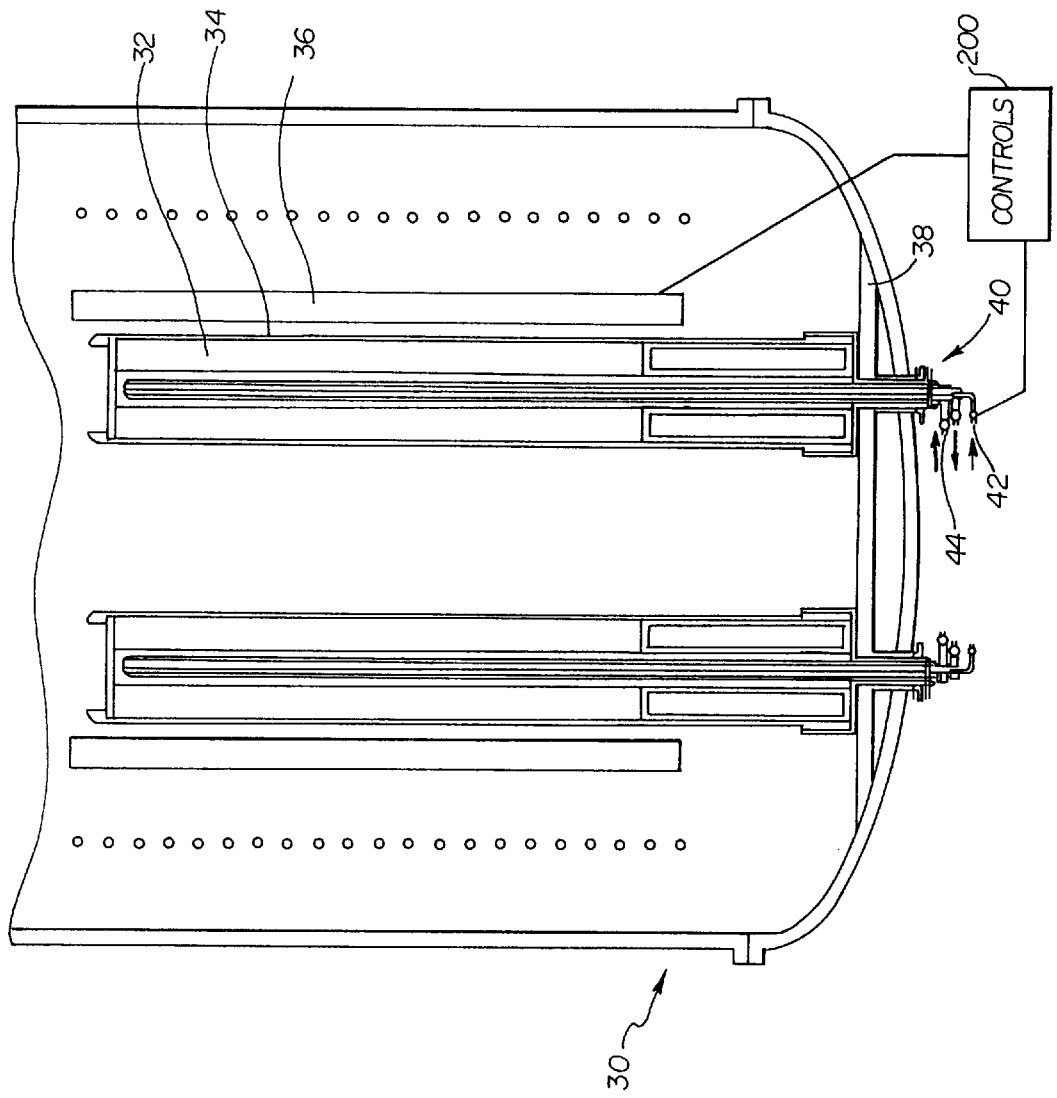
FIG. 2 shows an apparatus of the invention for radial densification with more than one substrate.

The radial process is predicated on the ability to penetrate or uniformly densify the wall thickness of the log. The outside and inside diameters of a typical large C—C rocket nozzle throat might be 26 and 13 inches and those of a large brake disk might be 20 and 12 inches, respectively. Therefore, the maximum radial penetration required is about 6.5 inches. The demonstrated effective penetration for axial densification of unidirectional preform is 8 inches. The radial process permits densification of a number of large final parts with minimal tooling and setup. The process may be conducted with gas flow from inside to outside or the reverse. As with the axial process described above the part temperature increases in the direction of gas flow. The annular part may be an undensified or a partially densified preform. Axial FCVI (flow thermal gradient CVI) densification is advantageous for early densification of the log preforms until deposition or penetration is limited by the reduced permeability of the part. For the radial process, each end of the annular parts must be closed and tooling enclosing the inside or outside surfaces (if used) must be permeable (e.g. porous or perforated). For inside to outside gas flow (preferred) the part is heated externally to a uniform surface temperature. The interior surface of the part is maintained at a temperature lower than the exterior by means of the flow of cooler process gas, a stream of liquefied process gas directed into the bore or against the inside surface of the part, a volume of liquefied hydrocarbon filling the cavity of substrate and/or by recirculating coolant passing through a tube placed within the bore of the annular part. FIG. 2, which illustrates radial densification, shows a configuration with such an internal coolant tube generally designated as 40.

FIG. 2 illustrates the preform positioning 32, the permeable shell or canister 34, the heating element or susceptor 36, the furnace floor 38, the cooling lance 40, the process gas inlet 42 and the coolant inlet 44.

Process gas (or liquid) and coolant are introduced through one of the closures in the end of the part 42 and 44, respectively. Process gas is introduced under pressure into the bore of the part and flows radially through the part into the furnace which is maintained at a pressure lower than the part interior by means of a vent or pump. As with the axial FCVI process, above, part temperature, temperature gradient, process gas composition, gas flow rate (residence time) and inlet and outlet pressures are chosen to provide the desired deposition profile within the preform. Again, the preferred profile is uniform, inlet to outlet surface, or a slightly increasing initial deposition profile, inlet to outlet, both of which may produce a uniformly densified final part.

Figure 3:
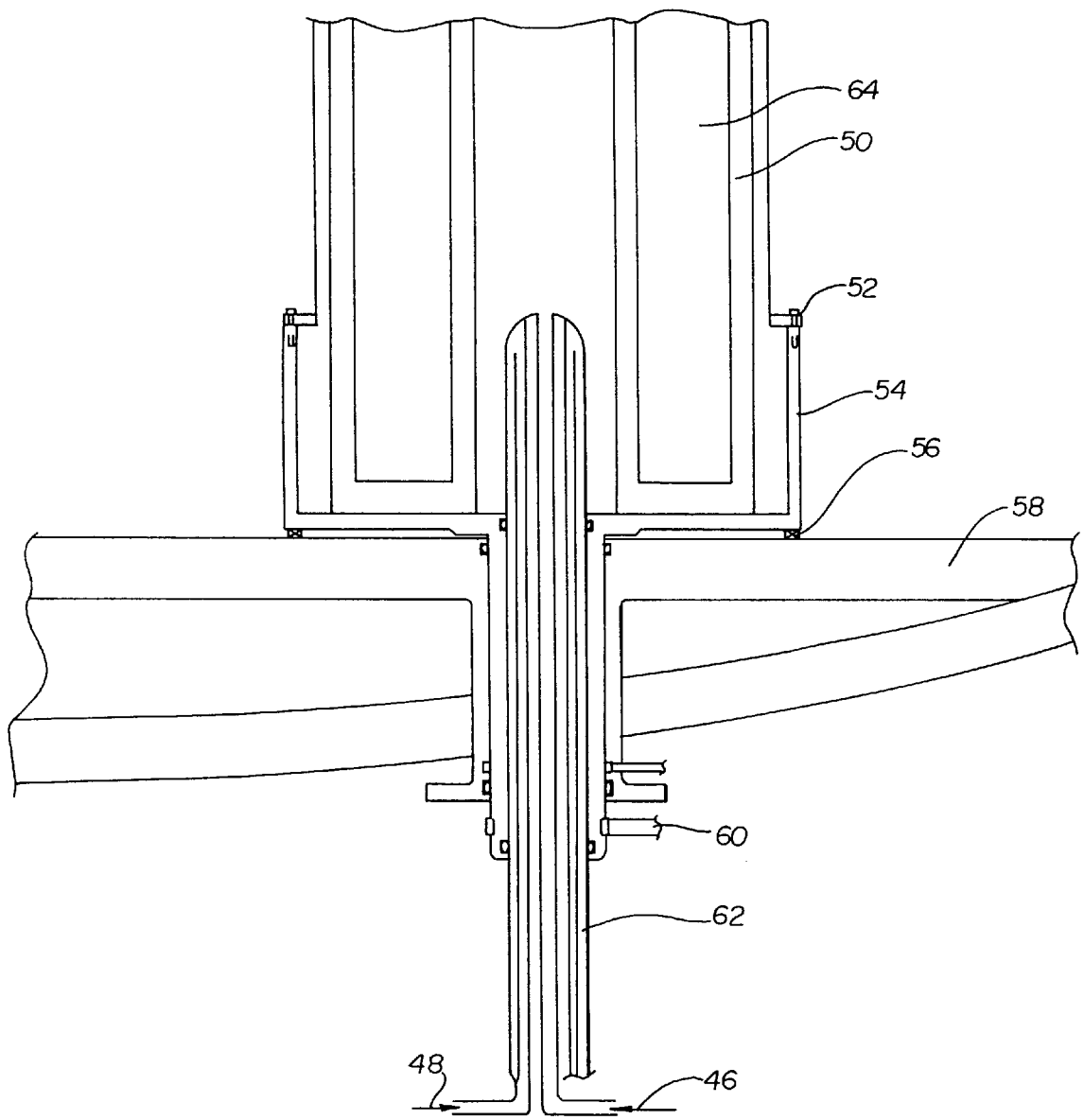
FIG. 3 shows a portion of the densification apparatus of the invention.

Densification of more than one substrate log may be accomplished using the radial process by placing substrate logs in a circular pattern in the furnace. The preforms in radial densification are placed in shells or canisters, through which the parameters may be controled. To provide uniform heating of the surface each log must be rotated about its axis. FIGS. 2 and 3 show a method for radial forced CVI which provides for rotation (O-rings) of the part.

FIG. 3 illustrates the process gas 46 and coolant 48 inlets, a carbon pedestal 50, gas seals 52, a metal adapter 84, thrust bearing 56, the furnace floor 58, a drive belt (which may be a chain or a gear) 60, the cooling lance and a carbon black insulation 64 within the pedestal, which holds the preform in place.

Following densification the log is sectioned into billets from which individual parts may be machined.

A number of preform logs may be densified simultaneously in a single furnace by placing the logs vertically around the periphery of the furnace inside the cylindrical heating element or susceptor. Uniform heating of the outside surface of each log is achieved by rotating each log about its axis. An arrangement for conducting this process is shown in FIG. 3.

Certain processes or applications require, at an intermediate point during densification, heating the part to higher temperatures (2800 to 4500° F.) without process gas flow or deposition. This may be accomplished without cooling or disturbing the furnace and its load by withdrawing all but the end of the cooling lance and stopping flow of coolant and process gases. The furnace temperature is then increased to the desired "heat treat" temperature. Following the heat treat cycle the furnace is returned to the deposition temperature, the cooling lance is again fully inserted and flow of coolant and process gas is resumed.

In contrast to the present inventive process, the devices and/or methods previously used or proposed for solution to the problem which is solved by the present inventive process, rather than attempting to control the deposition profile the prior processes used a "deposition front" approach. Deposition begins at the outlet (hot) end of the part. As part density and conductivity increase, deposition moves toward the inlet end until the part is uniformly densified. The prior art targeted thin parts (about 0.8 inches or less). These substrates are so thin as to make the issue of controlling deposition profile moot.

The present process has demonstrated rapid and uniform densification of parts up to 8 inches from inlet to outlet. Densification of parts thicker than currently demonstrated appears highly feasible. Uniform, increasing and decreasing deposition profiles have also been demonstrated and the process conditions influencing deposition profile identified, providing the ability to control deposition profile. With the present inventive process densification of long, thick walled cylinders which would later be cut into ITE billets or thin brake disks is possible. Prior processes which densify individual disks require tooling and connection to a gas source and the establishment of a thermal gradient.

In the present process, parts may be heated by any method: external resistance or induction heat (preferred) or by inductively coupling or resistively heating the part directly. The furnace base plates may be designed to accept a number of preforms (equivalent to stacks) with a variety of part sizes in efficient arrangements.

In further experiments using the above inventive process, a preform of dry unidirectional carbon fiber (64% fiber volume) was held in a 20 mm (0.787 inch) ID quartz tube. The fiber preform was 0.20 m (8.0 inch) long. The junctions of five thermocouples were spaced along the axis of the preform. The quartz tube extended beyond the ends of the preform and was supported by O-ring seals in metal adapters at the top and bottom of a resistance furnace (As seen FIG. 1). Hydrocarbon and hydrogen process gas flow was controlled by individual mass flow meters. The mixed process gas was passed through the heated preform in the center of the furnace where it deposited carbon on the fiber surfaces.

Since the gas was constrained to pass lengthwise through the preform the preform represented a 0.20 m (8 inch) thick part. The outlet end of the tube was connected to a roughing pump. Outlet pressure was regulated by a controlled flow of argon gas injected into the vacuum line. The inlet pressure varied during the run as a function of flow rate and the changing permeability of the preform.

The investigation encompassed a broad range of settings for the critical process parameters. Designed experiments after the methods of Taguchi[1] are used throughout the study. The objective of the study was to identify processes which provide, at any time during the process, a uniform deposition rate end-to-end within the preform. In actual practice the deposition rate at the inlet and relative to that at the outlet end will increase somewhat during densification, thus, processes which were developed begin with a slightly higher rate at the outlet relative to the inlet end of the preform.

Two fiber types, P55 pitch-based fiber from Amoco and AS4 PAN-based fiber from Hercules were used. The average filament diameter of P55 fiber is 10 micrometers, density is 2.00 g/cm$^3$ and thermal conductivity in the fiber direction is 110 W/m K. AS4 fiber has an average filament diameter of 8 micrometers, a density of 1.80 g/cm$^3$ and a fiber direction thermal conductivity of 10 W/m K. The experiment investigated the effects of the two fiber types plus seven process parameters, each at three levels as shown in Table 3. Runs of 18 combinations of these factors are required for the Taguchi analysis. A run time of 16 hours was selected.

The temperature of the outlet is held constant throughout the run. The three temperature gradient levels are obtained by placing one of three insulation configurations around the quartz tube. As a result, the actual gradients vary based on fiber conductivity, gas flow rate and the thermodynamics of the internal chemical reactions. The temperatures of the outlet (upper) and of the specimen were normalized using rate constants from Tesner[2] to provide equal deposition rates for the several hydrocarbon gases. However, the temperatures for ethylene were increased when early runs indicated that deposition rates were not similar to those experienced with methane and propane.

TABLE 3

Designed Experiment Factors One-Dimensional Flow Study

| FACTOR | LEVEL 1 | LEVEL 2 | LEVEL 3 |
| --- | --- | --- | --- |
| Fiber type | AS4 | P55 | — |
| Maximum outlet and temperature | low | mid | high |
| Rate normalized maximum temperatures | methane 955° C. propane 889° C. ethylene 847° C. | methane 1042° C. propane 968° C. ethylene 952° C. | methane 1141° C. propane 1050° C. ethylene 1082° C. |
| Part temperature gradient | mid (300–350° C.) (1.5–1.7° C./mm) | low (200–250° C.) (1.0–1.2° C./mm) | high (400–450° C.) (2.0–2.2° C./mm) |
| Hydrocarbon gas | methane | ethylene | propane |
| H$_2$ to hydrocarbon volume ratio | 0 | 1:9 (10 vol. %) | 2:1 (66.7 vol. %) |
| Average carbon flow rate | 4 g/h | 8 g/h | 12 g/h |
| Carbon normalized average flow rate | 8.031 ml/h methane 3.992 ml/h ethylene 2.511 ml/h propane | 16.06 ml/h methane 7.984 ml/h ethylene 5.222 ml/h propane | 24.09 ml/h methane 11.98 ml/h ethylene 7.833 ml/h propane |
| Flow profile | 200% to 0 linear | 150% to 50% linear | constant |
| Outlet pressure | 130 kPa (975 torr) | 13.3 kPa (100 torr) | 1,33 kPa (10 torr) |

To provide an equal basis for comparing the three hydrocarbon gases the gas flow rate was normalized as carbon flow rather than volumetric flow. Carbon flow rates were selected to minimize the possibility that, for any combination of process conditions, the differential pressure across the quartz tube would exceed 8690 kPa (5200 torr or 100 psid): the pressure rating of the tube. However, several runs approached this limit and were ended prematurely due to either complete densification or partial densification causing blockage.

The mid and high levels for hydrogen concentration were selected based on the work of Tesner which shows a precipitous drop in deposition rate with small hydrogen concentrations. At higher hydrogen levels the deposition rate is low, but less affected by changes in hydrogen concentration. Between the rapidly falling and stable zones is a transition or "knee" in the curve. Carbon deposition liberates hydrogen. Thus, hydrogen concentration increases as the gas moves through to preform. A forced flow process without added hydrogen might experience an abrupt change in deposition rate along the length of the preform requiring an equally abrupt change in temperature to compensate. Since the reduction in rate is greatest at low hydrogen levels, adding hydrogen to the process gas reduces the effect of the hydrogen, liberated in situ. Hydrogen levels were selected to place processes in the more stable parts of the Tesner curves. In the case of methane at pressures up to atmospheric the effect of small quantities of hydrogen is severe but the curve levels was at about 10% hydrogen. A 2:1 hydrogen to hydrocarbon gas ratio (67% $H_2$) was selected to reduce the effect of hydrogen for other gases and for processes at higher pressures.

Dry unidirectional fiber preforms were wound on a frame, with the number of yarn ends controlled to maintain the desired fiber volume. After removal from the frame, the inlet end inner yarns were trimmed leaving the outer sheath of fiber in place as loops. Using these loops the preform was then pulled part way into the quartz tube, the outlet end trimmed and the preform positioned in the center of the tube. The preform/tube was then inspected using computed tomography providing a baseline to determine the amount and distribution of deposition within the specimen after densification.

Preliminary runs were conducted to establish temperature gradients which would produce deposition bracketing the desired uniform deposition. Early runs used gradients of 50° C. and 75° C. which resulted in localized deposition mostly within the 5 to 10 cm (2–4 inches) nearest the inlet end of the preform with diminishing deposition in the remaining preform. Subsequent runs with 250° C. and then 150° C. gradients produced slightly progressive deposition (where deposition rate increases with distance into the preform) and neutral deposition, respectively. Since progressive deposition is preferred at this stage of partial densification, gradient ranges of 200–250° C., 300–350° C. and 400–450° C. were selected.

Computed tomography (CT) inspection of the preforms (except runs 3 and 8) and densified specimens was conducted in the advanced computed tomography inspection system (ACTIS). The inspection produced image slices parallel to the part centerline, ten small carbon density standards calibrated by Southern Research Inc. were placed adjacent to the part for each inspection. The density standards ranged in density from 0.137 to 2.178 g/cm$^3$. A linear regression of CT number vs. Density for the standards calibrated each inspection.

Process parameters and results for the six constant flow runs are summarized in Table 4. The objective of the initial phase of the study was to assess the effect of the various process parameters on matrix distribution and microstructure. The specimens were not processed to complete densification. In later phases of the study the target final densified void volume was 8 to 10 percent which translates to a density of about 1.75 g/cm$^3$ for PAN fiber composites and 1.89 g/cm$^3$ if pitch-based fiber is used. The densified specimens are shown in Drawing 16.

The CT density profiles of the six runs are shown in FIGS. 13a, 13b, 14a, 14b, 15a and 15b with the temperature profile during processing superimposed FIGS. 13a–15b illustrate densified specimen and preform density profiles and run temperature profiles of unidirectional specimens. Specimens U3, U4a, U8, U11a, U13A and U18a, respectfully, are shown in FIGS. 13a, 13b, 14a, 14b, 15a and 15b. The process conditions may be found in Table 4.

Inlet end density for densified specimens U3 and U4a was lower than that of the initial preform due to spreading of the unrigidized fiber after removal from the quartz tube. It is reasonable to conclude that for each combination of process conditions there is a linear temperature gradient which would center deposition within the finished part. The appropriate gradient will produce relatively uniform deposition.

TABLE 4

Forced Flow CVI Run Summary

| Run | Outlet lamp | Temperature gradient initial-final | Process gas | Carbon flow rate | Flow profile | Outlet pressure torr | Inlet pressure torr | Carbon dep. | Carbon yield | Average density g/cm$^3$ | Average void volume | Residence time initial | final |
|---|---|---|---|---|---|---|---|---|---|---|---|---|---|
| AS4 fiber | | | | | | | | | | | | | |
| 3 | 880° C. | 383–409° C. | propane, 87% $H_z$ | 12 g/h | const. | 10 | 1379–1946 | 2.58 g | 1.34% | 1.18 | 54.9% | 1.0 | 1.4 |
| 4 | 1041° C. | 343–340° C. | methane, 10% $H_z$ | 8 g/h | const. | 10 | 825–818 | 5.82 g | 5.3% | 1.26 | 30.8% | 0.5 | 0.6 |
| 8[3] | 1059° C. | 231–175° C. | propane, 10% $H_z$ | 4 g/hr | const. | 975 | 650–3850 | 13.8 g | 52.9% | 1.35 | 28.4% | 9.2 | 13.7 |
| P55 fiber | | | | | | | | | | | | | |
| 11a | 995° C. | 185–189° C. | methane | 12 g/h | const. | 100 | 1450–2191 | 8.78 g | 4.5% | 1.40 | 29.8% | 0.9 | 1.1 |
| 11b | 955° C. | 156–167° C. | methane | 12 g/h | const. | 100 | 1499–1901 | 6.50 g | 3.4% | (1.38)$^2$ | 31.3% | 0.9 | 1.0 |
| 13 | 952° C. | 210–234° C. | ethylene, 87% $H_z$ | 4 g/hr | const. | 100 | 942–1374 | 8.24 g | 12.9% | 1.45 | 27.0% | 1.3 | 1.0 |

TABLE 4-continued

Forced Flow CVI Run Summary

| Run | Outlet lamp | Temperature gradient initial-final | Process gas | Carbon flow rate | Flow profile | Outlet pressure torr | Inlet pressure torr | Carbon dep. | Carbon yield | Average density g/cm³ | Average void volume | Residence^time initial | final |
|---|---|---|---|---|---|---|---|---|---|---|---|---|---|
| 18[3] | 1082° C. | 400° C. | ethylene | 8 g/h | const. | 975 | 1029–5025 | 22.9 g | 80.2% | 1.60 | 20.3% | 2.4 | 4.9 |

[1]Residence time calculations neglect gas reactions: actual residence time is shorter due to the liberation of hydrogen
[2]Density from computed tomography accept values in parentheses are from specimen weight and dimensions
[3]All runs densified 18 hours accept U6 for 6.5 hours and U18 for 4.75 hours. Both runs were terminated due to excessive inlet pressure.

Effects of Hydrogen and Residence Time:

In industrial processes and most investigations deposition occurs in a mixture consisting of the parent hydrocarbon, reaction products intermediate to deposition and other reaction products which will not become deposited carbon. Several researchers have identified the species present during deposition[3–4]. Tesner[2] preferred to determine kinetic data for deposition from a known hydrocarbon (methane, for example) rather than from this mixture. To do this Tesner maintained the degree of decomposition of the hydrocarbon to less than 1 percent. Runs with hydrogen added to the hydrocarbon provided the rate vs. hydrogen concentration curves mentioned. The approach ensured that in the gas stream not only did the hydrocarbon itself not change, but also that the hydrogen concentration remained constant. For the present study this data indicated that runs conducted without added hydrogen might experience a marked decrease in deposition a short distance downstream of the initial deposition zone due to hydrogen liberated in the initial zone. Hydrogen liberation of 2 percent of the total gas volume would reduce the deposition rate to only 50–60% of the rate at the inlet where, presumably, the hydrogen concentration was zero.

Figure 14A:
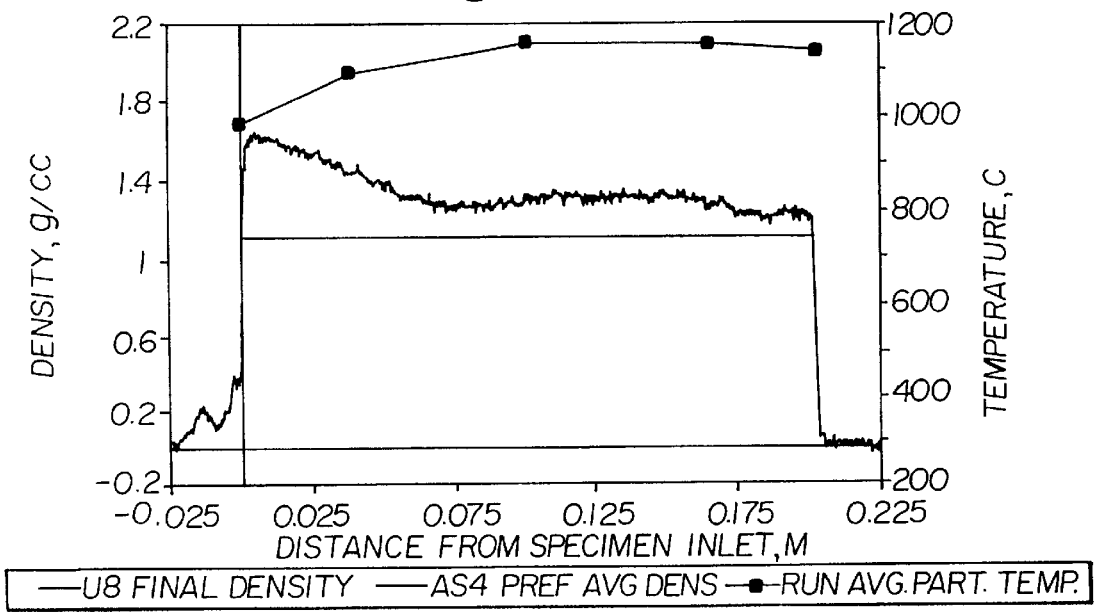
Figure 14B:
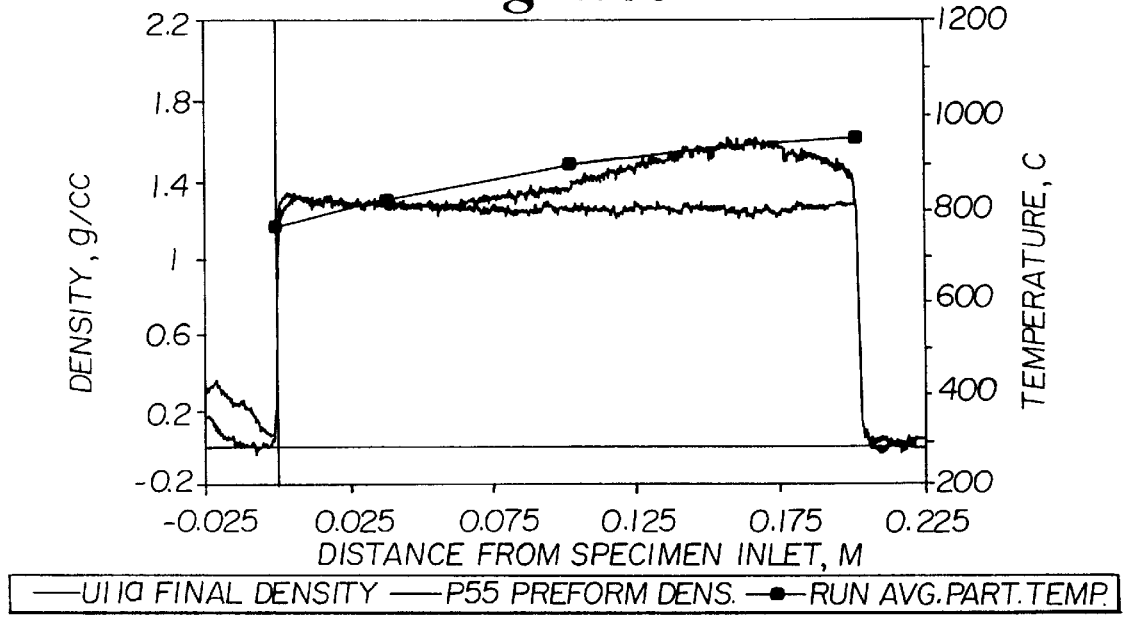
Figure 15A:
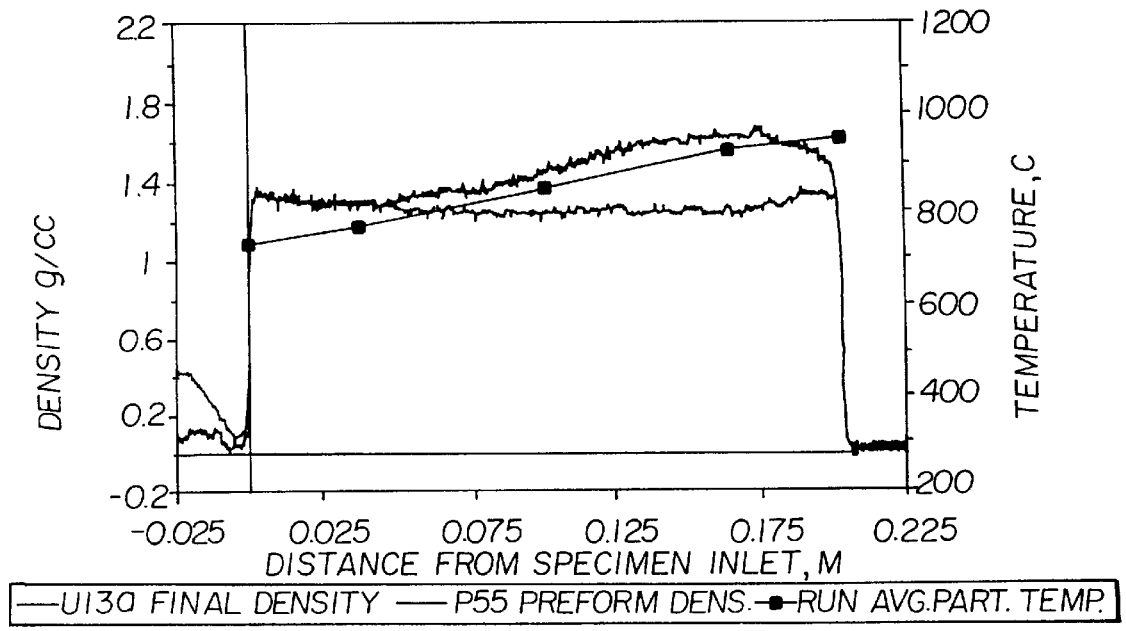
Figure 15B:
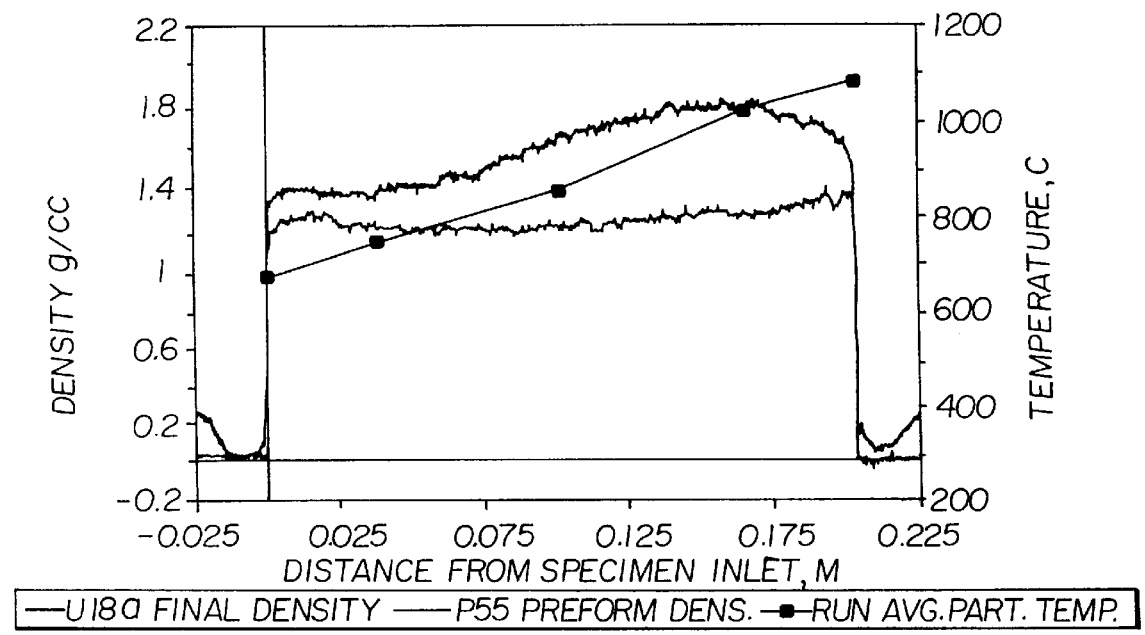
Figure 16:
FIG. 16 illustrate densified specimens.

Runs 11 and 18 were conducted without added hydrogen and with fairly linear temperature profiles. Rather than a density spike at the inlet, the density profiles of both runs show a zone at the inlet end where very little deposition beyond fiber rigidization occurred followed by increasing density to a peak near the outlet end (FIGS. 14b and 15b). The low inlet temperatures of both runs, approximately 810° C. for run 11 and 680° C. for run 18 reduced the deposition rate and, hence, the rate of hydrogen release at the inlet. Hydrogen concentration in the gas stream increased slowly with distance into the preform and for a distance is more or less offset by the increasing temperature. Farther from the inlet the increased temperature overcomes the increasing hydrogen concentration producing rapid deposition. In the 15 runs (including pathfinder and repeat runs) only run 8 shows a marked increase in deposition at the inlet end for reasons discussed below. However, a high deposition rate process without added hydrogen and with the gradient optimized to produce overall uniform or slightly progressive deposition might experience increased deposition at the inlet. Some level of added hydrogen would be desirable. The characteristics of forced flow CVI prevents the severe reduction in deposition rate measured by Tesner. In Tesner's study high gas flow rate replenished the hydrocarbon and swept reaction products including hydrogen away from the substrate surface. In the forced flow process the gas will always contain hydrogen from prior deposition at that location, even at the inlet. Thus, no portion of the process operates in the steepest portion of the rate vs. hydrogen concentration curve. Hydrogen concentration does increase from inlet to outlet and this concentration gradient drives hydrogen diffusion toward the inlet. The purpose of the temperature gradient is to counteract the inhibiting effect of this concentration gradient and distribute deposition more or less uniformly over the length of the preform.

Indications of hydrogen inhibition from the added hydrogen have been observed. However, run U13 indicates that even with 67% added hydrogen and at the mid level temperature, 952° C., significant deposition occurs (FIG. 15a). Runs 11 and 18 indicate that, with the appropriate gradient, relatively uniform deposition might be achieved without added hydrogen and run 13 indicates that, with adequate temperature, high rate deposition should be obtained despite high hydrogen concentrations.

Run 8 illustrates the effect of residence time on the location of deposition within the preform. The combination of high temperature, 1059° C., and small temperature gradient, approximately 200° C., produced a high inlet temperature, averaging about 860° C. For this reason, increased deposition at the inlet was expected. However, the deposition was very regressive with deposition localized almost entirely in the first 50 mm (2 inches) of the preform (FIG. 14a). In comparison, a preliminary run (UP4) with a lower temperature and gradient (1014° C. and 80° C., respectively) and methane/10% H₂ process gas produced a neutral, nearly uniform deposition profile. The difference is the residence time: the time required for the process gas to pass through the preform. The residence time for run 8 ranged from 9 seconds at the beginning of the run to 14 seconds at the end. Preliminary run UP4 residence time was about 2 seconds and the longest time of the remaining runs was 5 seconds (run 18). The long residence time of run 8 provided ample time for deposition on surfaces near the inlet, removing much of the available carbon and liberating hydrogen. In the case of run 8 inlet pressure increased rapidly resulting in termination of the run after 6.5 hours at an inlet pressure of 3850 torr.

A characteristic of forced flow CVI is the tendency for deposition to shift toward the inlet end of the preform as densification progresses. As a result, an ideal process begins somewhat progressively. This shift is caused by a number of factors. Deposition at any point increases pressure and hence, deposition rate, at all points upstream. Increased pressure within the preform also increases gas residence time (partially offset by reduced specimen void volume). Deposited carbon increases part conductivity with decreases the temperature gradient. Each of these developments shifts deposition toward the inlet. The increased deposition toward the inlet increases the hydrogen content of the gas downstream. Processes which are initially progressive will likely become more uniform as deposition progresses. While the shift may be small for processes with a fairly uniform deposition profile, initially regressive processes such as run 8 are unstable, becoming more regressive as densification progresses. Deposition near the inlet further localizes subsequent deposition as pressure upstream of the deposition zone increases while pressure downstream of the zone remains low. Finally, a nearly densified part which is somewhat progressive in the distribution of matrix might still be completed, as the hydrogen reaction product will pass through the small pores of the densified outlet end. Completion of a nearly densified regressive part requires that the process gas pass through the nearly blocked channels and then deposit at the far side.

Each of the eight factors which were investigated clearly affected the distribution of deposited carbon with temperature, temperature gradient and gas residence time having the strongest effects: The analysis of the 18 runs quantified the effect of each parameter and identified the process(es) most stable with respect to deposition uniformity. Uniformity was maximized and process time was minimized.

In another application of the present process, the substrate is a column of fibrous material of generally circular cross section with a central cavity or a stack of fibrous disks of generally circular cross section with a central cavity. The preform may be carbon fiber and may be formed of woven, braided, wound or needled shapes, plies or layers or of chopped fiber or other construction. The substrate column or stack may be self supporting, being a cohesively woven dry fiber body or a rigidized fiber body. Or the substrate column or stack may be contained within and constrained by a rigid shell. Rigidization of the preform may be by impregnation with a carbon yielding binder such as coal tar or petroleum pitch or phenolic, furfural or other resin forming a carbon char when heated to decomposition. The binder may be carbonized prior to the CVI densification disclosed by the invention or carbonization may be accomplished during heat up to the CVI densification temperature. Rigidization may also be by other modes of CVI densification including the CVI method described herein where gas now is in the direction of the substrate axis. Fibrous disks stacked to form a substrate column may be separated by rigid carbon plates or flexible graphite sheets to maintain flatness and aid in separation of the disks following densification. (not shown)

FIG. 4 shows a densification module, generally designated 70. The substrate 72 is placed in a cylindrical canister 74 which is open on one end. The canister 74 may be of any structural material compatible with the process temperature and environment such as amorphous carbon, ceramic, quartz, or refractory metal. Carbon—carbon is the preferred canister material and an equally preferred material is carbon—carbon in the lower portion where high thermal conductivity and high temperature capability are required attached to ceramic or ceramic composite material such as SiC/SiC in the portion nearest the adapter to reduce heat conduction to the O-ring seals and metal components.

One end of the canister is closed, either permanently, or with a removable closure plate 76 as shown in FIG. 4. The canister wall 74 is permeable to the flow of the reactive and byproduct gases, containing one or more holes or a number of smaller perforations 78 in the wall. For self supporting substrates there may be a space between the outer surface of the substrate and the inner surface of the canister wall to facilitate installation and removal of the substrate and the flow of gas from the substrate. Nonrigid substrates are supported and constrained by the canister. Perforated flexible graphite sheet is placed against the inner surface of the canister between canister wall and the outer surface of the substrate to facilitate removal of the densified part from the canister. The canister may be tapered or in a clamshell configuration to further aid in removing the part.

The substrate 72 is placed in the canister 74 against the closed end. A pedestal 80 is placed on the substrate 72. The pedestal 80 may be of amorphous carbon, ceramic, quartz or other high temperature material and may be a cylinder with an annular plate to support the substrate as shown in FIG. 5 or other suitable shapes including, but not limited to, that shown in FIG. 4. The preferred pedestal material is amorphous carbon, configured with insulating carbon black in the interior as shown in FIG. 4 to reduce conduction of heat to the seals and water cooled furnace lids.

A disk of flexible graphite (not shown) may be placed between the substrate and the closure 76 and/or pedestal 80 to facilitate sealing and removal of the substrate from the tooling. Potting compound such as phenolic resin filled with carbon black as a thickener or C-34 carbonaceous cement (from UCAR Carbon Co.) may be used to form a seal between the disk of flexible graphite and the substrate. However, if the surfaces of both the substrate and the tooling are flat and relatively smooth leakage will be minimal and decrease as carbon deposits in the interface.

The canister is provided with a build up at the open end. A metal adapter 84 is placed over the open end of the canister and a ring 73 is fastened against the lip of the adapter firmly securing the canister to the adapter. The combined length of the substrate and pedestal is slightly longer than the length of the canister to compress the substrate and aid in sealing each end of the substrate and the canister and pedestal.

Figure 7:
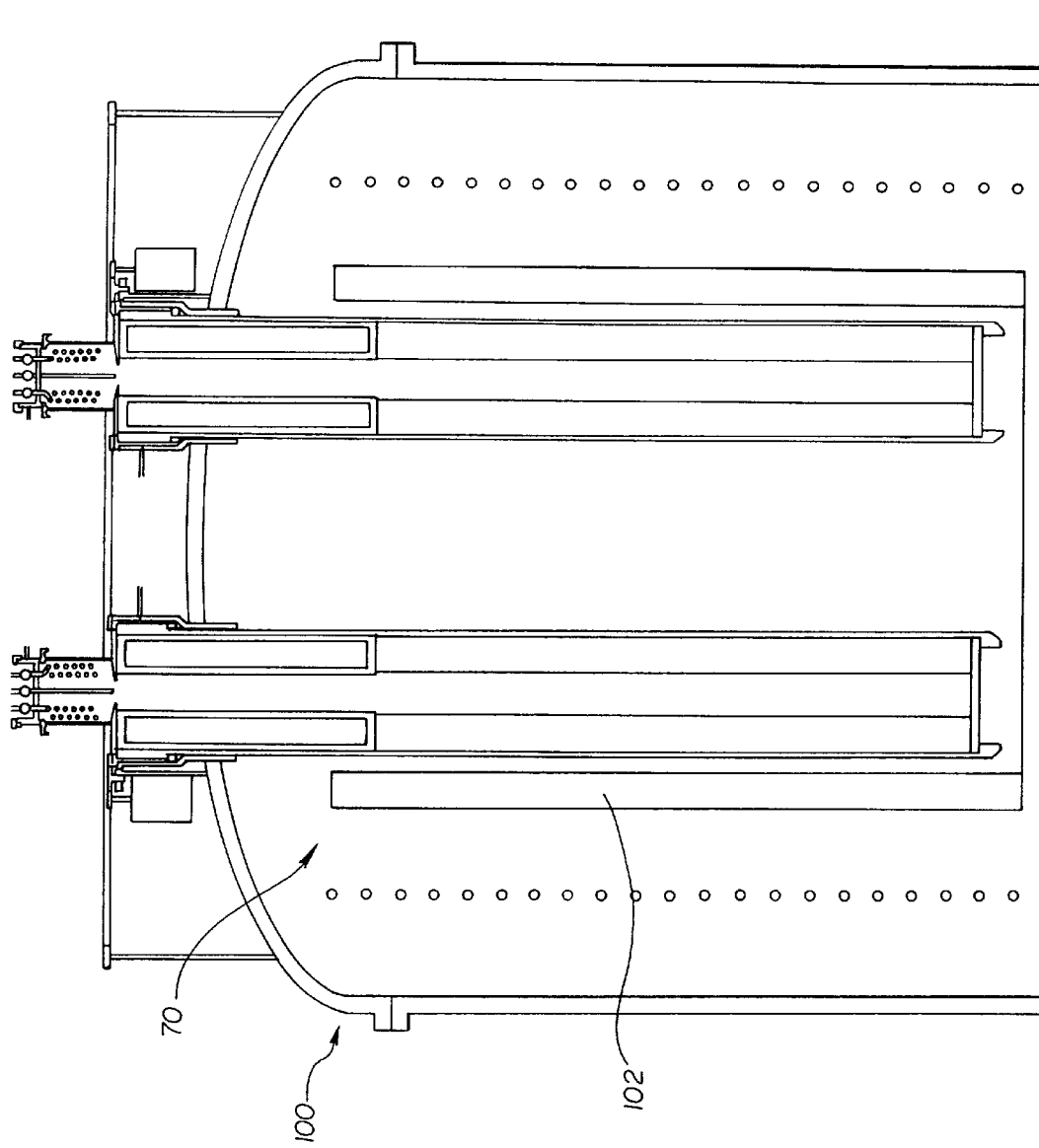
FIG. 7 shows an embodiment of the invention for accommodating multiple modules.

The substrate, canister and adapter, together with the apparatus necessary to cool the interior of the substrate, form a module 70 which may be assembled independent of the furnace and then installed as a unit into the furnace. The furnace may be resistance or inductively heated and existing furnaces with modified lids may be used, reducing facilities costs. FIG. 7 shows two of several modules installed into an inductively heated furnace, generally designated 100.

Figure 8:
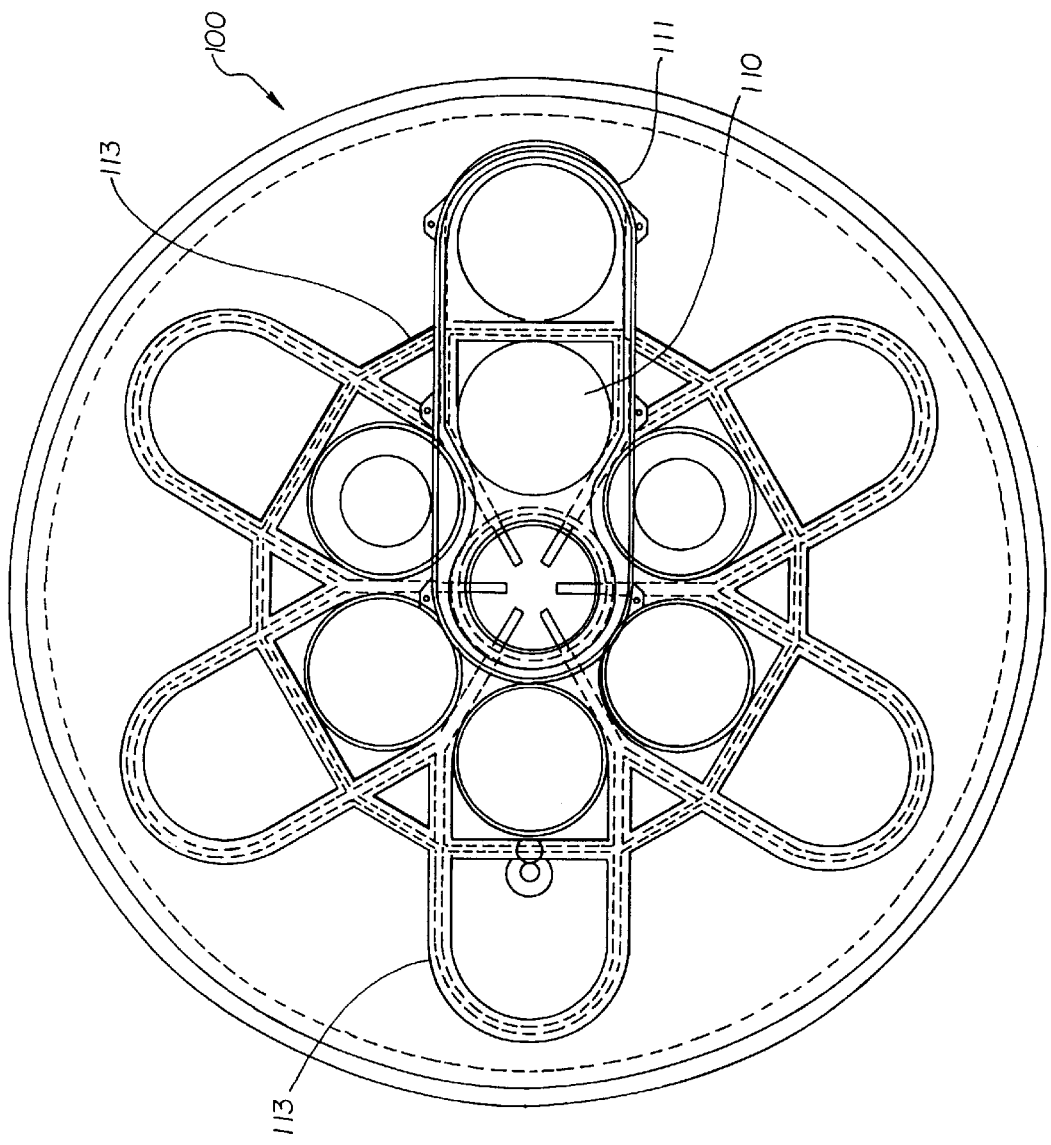
FIG. 8 shows a top plan view of the embodiment of FIG. 7.
Figure 9:
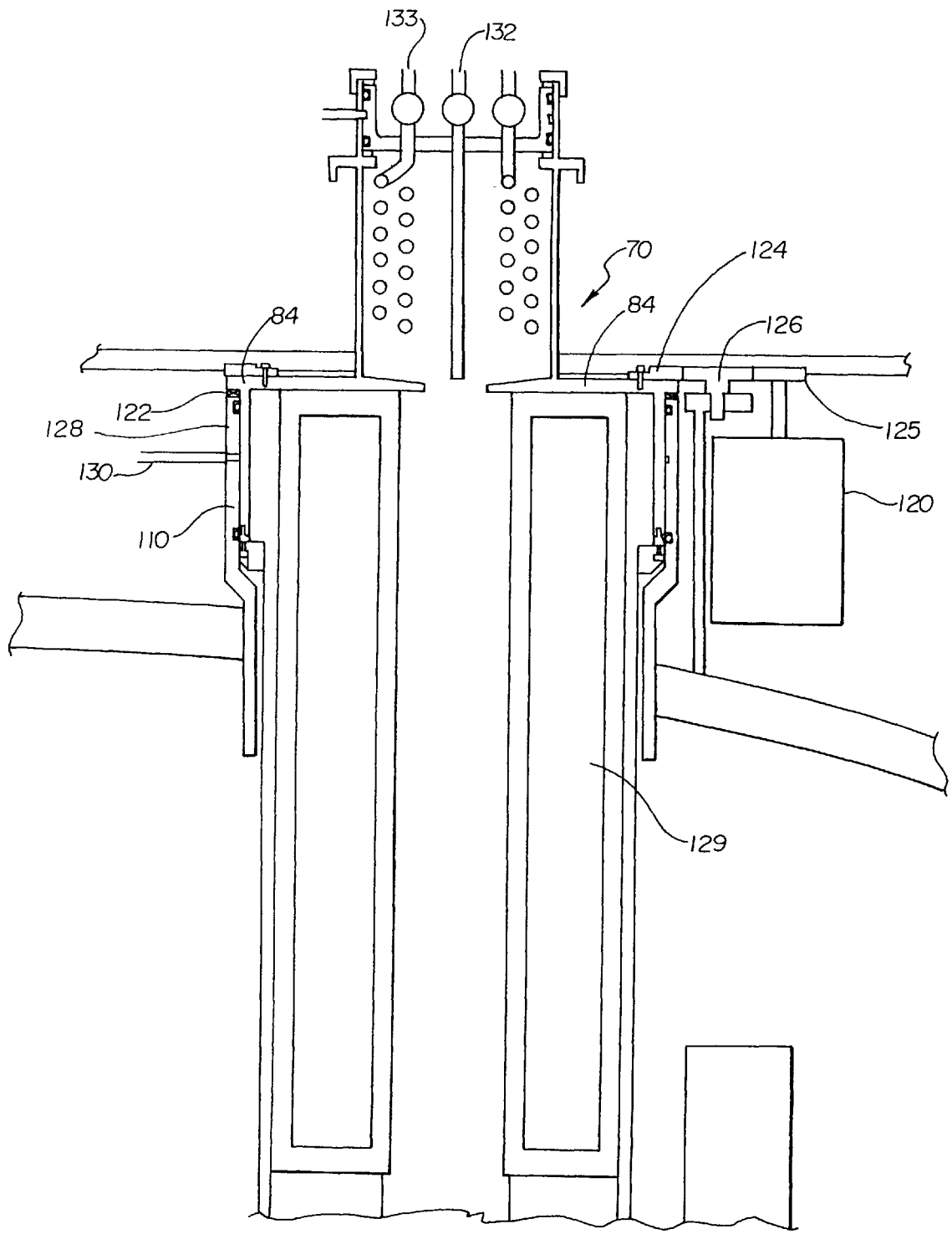
FIG. 9 shows a partial view of a densification module of the invention.

Ports 110 installed in the furnace lid (FIG. 8) accept several modules per furnace 100. The ports 110 are water cooled (not shown) and distributed in a circular pattern such that the canister is within the heating element or susceptor 102 of the furnace (FIG. 7). The canister may be positioned within a short distance (1 to 2 inches) of the heat source 102 as shown in FIG. 7. To maintain a uniform temperature around the circumference of the substrate the module is rotated about its vertical axis. Torque from the motor 120 shown in FIG. 9 is transmitted to the module 70 through gears or other means (ring gear 124, spur gear 126 and pinion 125). A thrust bearing 122 between the port lip 128 and adapter flange 84 supports the weight of the module and facilitates its rotation. O-ring seals are provided between the port and module and a vacuum gland 130 between the seals ensures that leakage due to the rotation is prevented from entering the furnace.

A single module, for a large part or small furnace, for example, may be placed in a central position coaxial with the furnace. When the module is coaxial with the furnace, rotation is not required.

In the several embodiments the reactant gas or liquid is introduced at point 132, into the substrate cavity 129 at a higher pressure than that of the furnace volume, which is generally maintained at a pressure lower than atmospheric. The reactant gas is driven through the preform by this pressure differential and encounters increasingly higher temperature as it progresses through the substrate. This counteracts the retarding effects on deposition of the decreasing concentration and pressure of the reactant.

The invention provides several means and associated apparatus to cool the substrate cavity 129 via introduction of coolant at point 133, and provide the necessary temperature gradient. FIG. 5 shows a module 70 consisting of substrate 72, canister 74 and adapter 84. The adapter is provided with a centrally located sleeve 140. A water cooled lance 142 extends through the sleeve and mates with O-ring seals 144 in the sleeve. Concentric tubes 146 within the cooling lance channel water through the length of the lance. A tube 148 through the center of the lance with an opening at the end of the lance provides for the introduction of the reactant gas or liquid. There may be a space between the lance and the inside surface of the substrate or the lance may contact the wall of the substrate, providing increased cooling. The lance does not rotate with the module.

A heat treat step at a temperature higher than the temperature for CVI deposition is often a part of the overall carbon—carbon densification process. Heat treat temperatures of 2800 to 4500° F. (1500–2500° C.) are typical. To protect the lance and permit it to be made of stainless steel or other nonexotic metal the lance may be withdrawn from the bore of the substrate and pedestal to the approximate position shown in FIG. 6. Withdrawal of the lance may be accomplished without first cooling the furnace, reducing the cost and time of processing. Following the heat treat step, and again without fully cooling the furnace, the lance may be reinserted and the flow of reactant gas or liquid resumed. The lance is restricted from being completely withdrawn from the sleeve by external or internal stops such as a ring clamped around the lance near its end (not shown).

In some processes the required temperature gradient may be difficult to achieve using a cooling lance. The adapter 84 of one embodiment of the invention contains a heat exchanger 83 which may be a system of water cooled tubes 83 as shown in FIG. 4. A nonrotating bulkhead 82 provides pass-throughs for the reactant and coolant supply tubes (132, 133). O-ring seals 37 and thrust bearings 71 facilitate the rotation of the heat exchanger housing 81 around the stationary bullhead. A vacuum gland between the seals removes leaked air.

Prior to the start of the process the module is evacuated. A hydrocarbon which is mostly liquid under the conditions of temperature and pressure of the substrate cavity is introduced into the substrate cavity through the tube (as seen in FIG. 4, at 119, filling the cavity to the top of the substrate or higher. Suitable liquid hydrocarbons include hexane, cyclohexane, heptane and toluene. Gaseous hydrocarbons, such as methane or propane may be introduced with the liquid to maintain an elevated pressure within the module. The flow of all reactants is metered according to the requirements of the process.

During the process the liquid hydrocarbon contacting the hot inner surface of the substrate vaporizes. A portion of the vaporized hydrocarbon passes through the porous substrate depositing carbon and densifying the substrate. The remainder rises into the heat exchanger cooling coils 83 and is cooled and condensed and then returns as liquid to the substrate cavity. The movement of the vaporized reactant through the substrate is driven by the pressure differential across the substrate wall.

In this embodiment the system is prepared for a heat treat operation by shutting off the flow of reactants and heat exchanger coolant, depleting the reactants in the module cavities as the reactant vapor passes through and continues to densify the substrate. Cooling the furnace is not required and heating to the heat treat temperature may begin while some reactant remains.

As the deposition time is decreased relative to the isothermal CVI process the time required for heating to deposition temperature and, more especially, cooling prior to unloading the densified parts becomes more significant. Loading and unloading of modules into and from the furnace is accomplished through the ports 110 in the furnace lid with the furnace lid in place on the furnace. FIG. 8 shows the furnace lid. The ribs 113 reinforce the lid between the port openings 110 and also form an oval shaped platform 111 around each port. By covering the port with a loading enclosure 150 which is attached and sealed to the furnace lid and containing the means of inserting, retracting and storing a hot module, the furnace may be loaded and unloaded at or near deposition temperatures or even as other modules continue densification.

Figure 10:
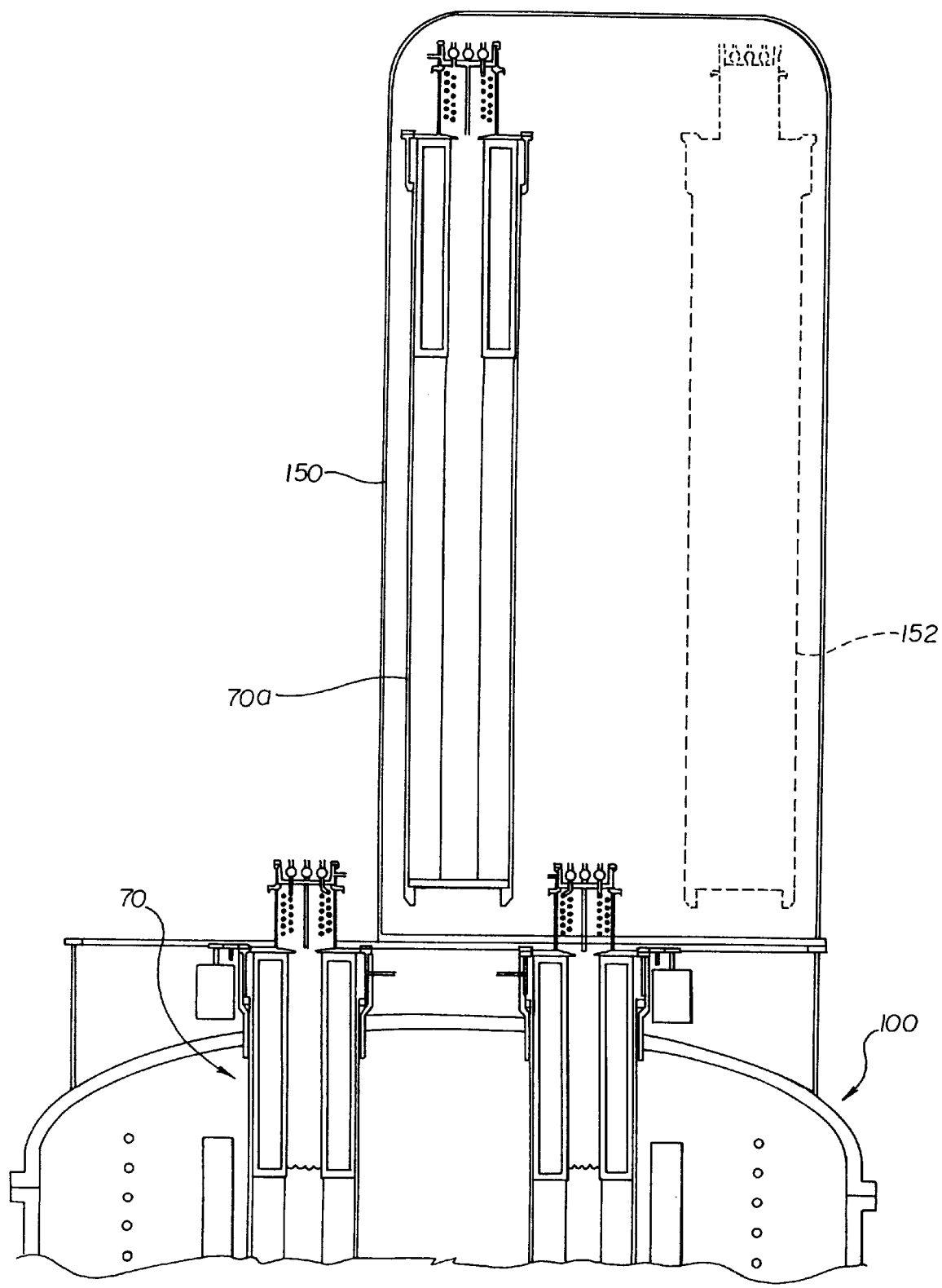
FIG. 10 shows a partial view of an apparatus of the invention including a loading enclosure.

FIG. 10 shows the furnace 100 with a loading enclosure 150 installed. The loading enclosure 150 is provided with an elevator 160 shown in FIG. 11 for manipulating the modules 70 in the enclosure. Not shown are the cooling lines around the wall of the enclosure which permit placement of a module 70 with a hot carbon—carbon part within the enclosure 150. Prior to installing the enclosure over a module in the furnace the drive mechanism for rotating the module is disconnected (the idler gear is removed, for example) and the valves in the supply lines for reactants and coolants are closed and the attached lines removed. A module with an undensified substrate 70a is positioned in the enclosure and then the enclosure is installed over the furnace port 110. After purging and equalizing the enclosure to the pressure of the furnace with inert gas the densified substrate with its module is grasped by the elevator, removed from the furnace and placed in the empty position 152, The new module is then moved over the port and the elevator lowers the module 70a into the furnace. After removing the enclosure 150 the drive mechanism for rotating the module and the supply lines for reactants and coolant are reconnected. When the substrate reaches the proper temperature, the flow of reactant is started.

The loading enclosure may also be configured to cover all of the ports in the furnace lid and equipped with an elevator capable of movement about multiple axes. The enclosure is loaded with a number of undensified parts prior to installation over the furnace lid enabling an entire furnace to be unloaded and reloaded with only one enclosure installation and purge operation.

The process may also be carried out with the reactant flow in the direction of the substrate axis. This method is conducted in a furnace equipped with a flat heating element or susceptor covering most of the bottom of the working volume in a top loading furnace or covering most of the top of the working volume in a bottom loading furnace. Modules containing substrates are positioned with the substrate perpendicular to the flat heat source and with one end of the substrate near the heat source. Or, in a more conventional furnace having cylindrical heat source 170, modules 179 are positioned with most of the substrate 172 outside of the heat source envelope 170 as shown in FIG. 12. In FIG. 12, the annular substrate 172 is arranged around a core of solid carbon 178. A pool of liquefied hydrocarbon rests on the upper end of the substrate/core. The upper portion of the module is cooled by the heat exchanger 180 while the lower portion is heated by the heat source 170. Due to the thermal gradient created and through pressurization from the top portion of the module, the liquid hydrocarbon is drawn down through the substrate, vaporizing on contact with the substrate. The by-product gases exit through the perforations at the bottom of the module. This arrangement minimizes facilities costs where an existing furnace can be modified for the process. The arrangement for bottom loading furnace with cylindrical heat source is similar to FIG. 11 but inverted, Both flat and cylindrical heat sources provide an increasing temperature in the substrate from the inlet end to the outlet; the end nearest the heat source. Modules are not restricted to a circular pattern near the periphery of the heat source but may be may be arrayed anywhere within the extended periphery of the heat source. Insulation such as carbon felt may be placed around or between the canisters to assist in establishing the desired temperature profile along the substrate anise.

The substrate is fibrous or otherwise porous; woven, branded, needled, chopped or other carbon fiber being preferred. The substrate may be annular or it may be a solid cylinder without a central cavity. The canister, made from carbon—carbon, or other material compatible with the process temperature and environment, is more or less impermeable to the reactants and may be of one piece or in a clam shell configuration to aid in disassembly. If the substrate is annular, a core, also impermeable and made preferably of amorphous carbon, is placed in the central cavity of the substrate and the substrate placed in the canister. Both core and canister fit snugly against the substrate and flexible graphite sheet may be placed between the substrate and both the canister and core to aid in removal after densification. The closure plate in the end of the canister contains holes which vent the gases exiting the substrate during the CVI process.

The canister is provided with a build up at the open end. A metal adapter is placed over the open end of the canister and a ring is fastened against the lip of the adapter firmly securing the canister to the adapter. The substrate, canister and adapter, together with the apparatus necessary to cool the interior of the substrate, form a module which may be assembled independent of the furnace and then installed as a unit into the furnace. Ports installed in the furnace lid accept several modules per furnace.

The heat source, whether flat or cylindrical, more or less uniformly heats the end of each canister. Module rotation is not required. However, modules may be rotated about the module axis to provide more uniform heat to the end of the substrate.

The reactants are introduced through the adapter and may be liquid or gas. The reactants in the cavity enclosed by the substrate, canister and adapter are maintained at a pressure greater than that of the furnace volume which propels the reactants to flow lengthwise through the substrate. The adapter end of the substrate may be cooled passively by conduction through the canister and adapter to the water cooled lid, or may be actively cooled by a water cooled plate against the end of the substrate. For liquid reactants, a heat exchanger 180 is provided in the chamber attached to the adapter to recondense vaporized reactant.

For long substrates the large temperature gradient required for simultaneous deposition throughout the substrate may be impractical and staged deposition, where deposition begins at the outlet or hot end and gradually moves toward the cooler inlet end may be preferred. The axial forced flow/thermal gradient process is most effective during the initial stages of densification when substrate permeability is high and high reactant flow rates can be maintained with modest inlet pressure. Thus, the axial method may find greatest application in partial densification or rigidization of fibrous substrates. Densification of the substrate may then be completed using other methods such as the method described herein where the reactants flow through the substrate wall in a radial direction.

The radial CVI processes are carried out with the outer (hotter) surface at temperatures ranging from 850 to 1400° C. (1550 to 2550° F.), preferably between 1000 and 1200° C. (1830 and 2200° F.), with thicker substrates generally processed at the higher temperatures. The inner surface is maintained at a temperature which provides a gradient of from 100 to 600° C. (180 to 1100° F.), preferrably 250 to 450° C. (450 to 800° F.) for a substrate with an 8 inch flow path (wall thickness). Thinner substrates require smaller gradients. The reactants are introduced at pressures of 100 to 10000 torr (2 to 200 psia) preferably 750 to 5000 torr (15 to 100 psia). The reactants may be introduced at constant flow rate or constant pressure or other flow rate or pressure schedules. Constant flow rate to a limiting pressure followed by constant pressure being one preferred method. Flow rate is a function of substrate geometry and penneability, usually chosen to provide a desired inlet pressure. Outlet pressure, the pressure maintained in the furnace volume, ranges from the capability of the pumping system to 1000 torr (20 psia), 10 to 100 torr (0.2 to 2 psia) preferrably. Higher inlet pressures must be used in combination with the higher end of the outlet pressure range.

Hydrocarbon gases include methane, propane, ethane, ethylene, propylene, butane with methane and propane being preferred. The hydrocarbon gas may be mixed with hydrogen to 90%, with 0–10% being preferable. Suitable liquid hydrocarbons include hexane, cyclohexane, heptane and toluene.

Although not described in detail herein, it should be understood that appropriate controls, monitors, mixers and regulators commercially available and known to those skilled in the art for controlling, monitoring and regulating temperature, pressure, flow rate, gas constituents and mixing of gases are utilized with the invention and are shown at block 200 in FIG. 5.

While this invention may be embodied in many different forms, there are shown in the drawings and described in detail herein specific preferred embodiments of the invention. The present disclosure is an exemplification of the principles of the invention and is not intended to limit the invention to the particular embodiments illustrated.

This completes the description of the preferred and alternate embodiments of the invention. Those skilled in the art may recognize other equivalents to the specific embodiment described herein which equivalents are intended to be encompassed by the claims attached hereto.

The references listed below are hereby incorporated by reference:

1. Madhaz Pbadke, Quality Engineering Using Robust Design, Prentice Hall, 1989.
2. P. A. Tesner, Kinetics of Pyrolytic Carbon Formation, *Chemistry and Physics of Carbon*, Vol. 19, ed. P. A. Thrower, pp. 65–161, Marcel Dekker, 1984.
3. D. B. Murphy, R. W. Carroll, Kinetics and Mechanism of Carbon Film Deposition by Acetylene Pyrolysis, *Carbon*, Vol. 30, No. 1, 1992, pp. 47–54.
4. P. Lucas, A. Marchand, Pyrolytic Carbon Deposition From Methane: An Analytical Approach to the Chemical Process, *Carbon*, Vol. 28, No. 1, pp. 207–219.

What is claimed is:

1. A method for densifying an annular porous fibrous substrate by infiltration with a gaseous compound, which upon contact with the substrate forms a solid residue and densities the substrate, the steps comprising:

a) placing the substrate within a canister, the canister having an adapter and being located within a furnace;

b) establishing a thermal gradient within and across the substrate by cooling a first side of the substrate and heating an opposite second side of the substrate, wherein the first side and the second side of the substrate are the inner and the outer sides of the substrate, respectively and wherein the inner side of the substrate is cooled and outer side of the substrate is heated;

c) infiltrating the first side of the substrate with pressurized vaporized hydrocarbon in the direction of the increasing temperature, the pressure of the vaporized hydrocarbon being greater than that of the pressure in the furnace, wherein the vaporized hydrocarbon flows radially outward through the substrate wall, whereby a carbon matrix is deposited within the substrate as forced flow of the vaporized hydrocarbon moves through the substrate due to the pressure differential between the first side of the substrate and the second side of the substrate; and d) controlling the thermal gradient and the pressures to deposit a carbon matrix throughout the substrate.

2. The process of claim 1, wherein a plurality of substrates and respective canisters are provided and are simultaneously densified.

3. The process of claim 2, wherein the substrates are rotated on their axis to provide uniform external heating of the substrates.

4. A method for densifying a porous fibrous substrate by infiltration with a gaseous compound, which upon contact with the substrate forms a solid residue and densifies the substrate, the steps comprising:

a) placing the substrate within a furnace;

b) establishing a thermal gradient within and across the substrate by cooling a first side of the substrate and heating an opposite second side of the substrate, wherein the first side and the second side of the substrate are the inner and the outer sides of the substrate, respectively and wherein the inner side of the substrate is cooled and outer side of the substrate is heated;

c) infiltrating the first side of the substrate with pressurized vaporized hydrocarbon in the direction of the increasing temperature, the pressure of the vaporized hydrocarbon being greater than that of the pressure in the furnace, wherein the vaporized hydrocarbon flows radially outward through the substrate wall, whereby a carbon matrix is deposited within the substrate as forced flow of the vaporized hydrocarbon moves through the substrate due to the pressure differential between the first side of the substrate and the second side of the substrate; and d) controlling the thermal gradient and the pressures to deposit a carbon matrix throughout the substrate.

* * * * *

UNITED STATES PATENT AND TRADEMARK OFFICE
CERTIFICATE OF CORRECTION

PATENT NO. : 6,083,560
DATED : July 4, 2000
INVENTOR(S) : Fisher et al.

It is certified that error appears in the above-identified patent and that said Letters Patent is hereby corrected as shown below:

Title page,
Insert -- Assignee: Alliant Techsystems Inc., Hopkins, Minnesota, --

Column 20,
Line 64, delete "densities" and insert -- densifies --.

Column 1,
Line 15, delete "NA58-37801" and insert -- NAS8-37801 --

Signed and Sealed this

Seventeenth Day of July, 2001

Attest:

NICHOLAS P. GODICI
*Attesting Officer*    *Acting Director of the United States Patent and Trademark Office*